(12) United States Patent
Kawata

(10) Patent No.: US 6,346,717 B1
(45) Date of Patent: Feb. 12, 2002

(54) SEMICONDUCTOR DEVICE, SUBSTRATE FOR ELECTRO-OPTICAL DEVICE, ELECTRO-OPTICAL DEVICE, ELECTRONIC DEVICE AND PROJECTION DISPLAY

(75) Inventor: Hirotaka Kawata, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/581,438
(22) PCT Filed: Jan. 4, 1999
(86) PCT No.: PCT/JP99/00004
§ 371 Date: Jun. 19, 2000
§ 102(e) Date: Jun. 19, 2000
(87) PCT Pub. No.: WO99/35678
PCT Pub. Date: Jul. 7, 1999

(30) Foreign Application Priority Data

Jan. 6, 1998 (JP) ............................................. 10-001175

(51) Int. Cl.[7] ...................... H01L 31/0232; H01L 27/01; H01L 27/12; H01L 31/0392
(52) U.S. Cl. .............................. 257/72; 257/59; 257/72; 257/350
(58) Field of Search ............................. 257/59, 72, 350, 257/435

(56) References Cited

U.S. PATENT DOCUMENTS 6,075,580 A * 6/2000 Kouchi ........................ 349/110
6,239,470 B1 * 5/2001 Yamazaki ..................... 257/350
6,243,146 B1 * 6/2001 Rho et al. ...................... 349/42

FOREIGN PATENT DOCUMENTS

| JP | A-61-220371 | 9/1986 |
| JP | A-64-28622 | 1/1989 |
| JP | A-7-318979 | 12/1995 |

* cited by examiner

Primary Examiner—Ngân V. Ngô
(74) Attorney, Agent, or Firm—Oliff & Berridge, PLC

(57) ABSTRACT

The potential at a channel region of a MOSFET on a substrate needs to be stabilized to assure a drain withstand voltage. To this end, a new potential line is additionally required. However, the addition of the potential line causes a drop in the aperture ratio in a transmissive type liquid-crystal display device, in which lightness is particularly important. A light shielding layer overlapping the MOSFET formed on the substrate is electrically connected to the channel region in the MOSFET.

33 Claims, 13 Drawing Sheets

(A)

(B)

(C)

SEMICONDUCTOR DEVICE, SUBSTRATE FOR ELECTRO-OPTICAL DEVICE, ELECTRO-OPTICAL DEVICE, ELECTRONIC DEVICE AND PROJECTION DISPLAY

BACKGROUND OF THE INVENTION

1. Field of the Invention

The present invention relates to a semiconductor device, a substrate for an electro-optical device, the electro-optical device, an electronic equipment, and a projector.

2. Description of Related Art

The SOI (Silicon On Insulator) technology in which a semiconductor device is formed on a silicon insulator film on top of an insulating substrate has been extensively studied because the SOI technologies offer high-speed, low-power consumption features and the high degree of integration in devices.

One of the SOI technologies is a manufacturing technique of an SOI substrate in which monocrystalline silicon substrates are laminated. In this method, called a lamination technique, after a monocrystalline silicon substrate and a support substrate are laminated using hydrogen bond force, the strength of the lamination is reinforced by a thermal treatment, and the monocrystalline silicon substrate is subjected to grinding and abrasion or a thin-film monocrystalline silicon layer is formed on the support substrate using etching technique. Since this technique directly constructs a thin-film monocrystalline silicon substrate, a resulting silicon thin film has an excellent crystallinity, leading to the manufacture of a high-performance device.

Known techniques developed from the lamination method include one technique (U.S. Pat. No. 5,374,564) in which hydrogen ions are implanted into a monocrystalline silicon substrate to be laminated onto a support substrate, and the thin-film silicon layer is separated from the hydrogen implanted region of the monocrystalline silicon substrate through a heat treatment; and another technique (Japanese Unexamined Patent Publication No. 4-346418) in which a monocrystalline silicon layer is epitaxially grown on a silicon substrate having a porous surface, the resulting substrate is laminated on a support substrate, the silicon substrate is then removed, and the porous silicon layer is then etched away so that the epitaxial thin layer of monocrystalline silicon is thus formed on the support substrate.

Like ordinary bulk semiconductor substrates, the SOI substrate manufactured in accordance with the lamination method finds widespread use in a variety of devices, but one of the differences from the conventional bulk substrates is that various materials may be used as a support substrate. As a support substrate, not only ordinary silicon substrate, but also transparent quartz substrate or glass substrate may be used. By forming a monocrystalline silicon thin film on a transparent substrate, a device that needs light transmissivity, such as a transmissive liquid-crystal display device, is manufactured, and a high-performance transistor device using a monocrystalline silicon having an excellent crystallinity is thus provided.

In the field-effect transistor on an ordinary silicon substrate, or so-called MOSFET (Metal Oxide Semiconductor Field Effect Transistor), by fixing a well potential, a channel potential of the MOSFET formed in the same well is fixed. In the SOI substrate, however, the substrate surface on which the channel region of the MOSFET is formed is an insulator, and the channel regions are electrically completely isolated from transistor to transistor, and the potential of each channel needs to be fixed on a per transistor basis. If the channel potential remains unfixed, the channel region is subject to carrier (charge) accumulation because of the effect of a floating substrate. Particularly when the channel region is constructed of a monocrystalline silicon, the charge mobility is high in the monocrystalline silicon, and a charge accumulates in the channel region because of a potential difference between the source and drain when the MOSFET is turned off. When the MOSFET is turned on, an excess current tends to flow. In the thin-film structure of the MOSFET, a diversity of problems arise, for example, an excess carrier (charge) lowers the breakdown voltage of the drain of the transistor element or causes a kink in the current-voltage characteristics of the transistor element. The fixing of the channel potential is thus required.

Known methods for fixing the channel potential using an excess charge include one technique called a source tie (IEEE Trans. Eelectron Device, Vol. 35, p. 1391, 1988) in which a channel and a source are equalized in potential by forming a conductive impurity zone in the source region identical to a channel in semiconductor type, and another technique called H(T) type gate (IEEE Trans. Electron Device, Vol. ED-36, p. 938, 1989, for example) in which a contact is formed on a channel region extending from the end of a gate.

SUMMARY OF THE INVENTION

Depending on the potential applied, the source and the drain alternate in a MOSFET which is arranged for each pixel in a liquid-crystal panel and which supplies each pixel with a voltage in response to a signal, and a symmetrical property is thus required of the MOSFET. To allow the MOSFET produced on the SOI substrate to drive the liquid crystal, the source tie structure that has an asymmetrical MOSFET structure cannot be used. To employ a fairly symmetrical H(T) type gate, a potential line for fixing the channel potential is required in addition to scanning lines and data lines. The transmissive liquid-crystal display device in which a lightness is important suffers a drop in the aperture ratio.

It is an object of the present invention to provide a semiconductor device which is made highly reliable and excellent in quality by fixing a channel potential of a MOSFET to a light shielding layer that shields the MOSFET from a light ray in a semiconductor device of the MOSFET formed on an insulator such as an SOI substrate, and to provide highly reliable and excellent quality substrate for electro-optical device, electro-optical device employing the substrate, electronic equipment employing the electro-optical device, and projector.

DISCLOSURE OF THE INVENTION

The semiconductor device of the present invention, having a semiconductor layer formed on an insulator, includes a transistor in which at least a channel region is formed in the semiconductor layer, and a light shielding layer for shielding the transistor from a light ray, wherein the light shielding layer is electrically connected to the channel region of the transistor. In accordance with the present invention, the light shielding layer shields the transistor from a light ray, preventing the transistor from erratically operating due to a leakage current arising from light and thereby stabilizing the potential of the channel. Since the voltage is applied to the channel of the transistor, the effect of a floating substrate is thus controlled by draining an excess carrier (charge) accumulated in the channel to the light shielding layer. The withstanding voltage of the transistor is thus improved, and kinks in the current-voltage characteristics of the transistor are controlled.

In the present invention, preferably, the transistor is an N-channel-type transistor, and the light shielding layer electrically connected to the channel region of the N-channel-type transistor is supplied with a low power source potential. In the N-channel-type transistor, the charge is accumulated in its channel region. By supplying the low power source potential, the excess carrier (charge) is efficiently drained and the potential of the channel is thus stabilized.

In the present invention, preferably, the transistor is an N-channel-type transistor, and the light shielding layer electrically connected to the channel region of the N-channel-type transistor is supplied with a potential equal to or lower than the lowest potential of the potential applied to one of the source and the drain of the N-channel-type transistor. The carrier (charge) is efficiently drained by supplying the low power source potential equal to or lower than the lowest potential of the potential applied to one of the source and the drain of the N-channel-type transistor.

In the present invention, preferably, the transistor is a P-channel-type transistor, and the light shielding layer electrically connected to the channel region of the P-channel-type transistor is supplied with a high power source potential. In the P-channel-type transistor, the charge is accumulated in its channel region. By applying the high power source potential, the excess carrier (charge) is efficiently drained and the potential of the channel is thus stabilized.

In the present invention, preferably, the transistor is a P-channel-type transistor, and the light shielding layer electrically connected to the channel region of the P-channel-type transistor is supplied with a potential equal to or higher than the highest potential of the potential applied to one of the source and the drain of the P-channel-type transistor. The carrier (charge) is efficiently drained by applying the high power source potential equal to or higher than the highest potential of the potential applied to one of the source and the drain of the P-channel-type transistor.

In the present invention, preferably, the semiconductor layer in the channel region of the transistor extends and forms a contact region of the same conductive type, and the contact region is electrically connected to the light shielding layer. Rather than arranging a contact hole for charge draining immediately on top of or beneath the channel region, the semiconductor layer of the channel region is extended to connect to the light shielding layer. The film thickness of the channel remains unchanged and the switching operation of the transistor is not affected. Furthermore, since the contact region is constructed of the same conductive type as that of the channel, applying the channel with the voltage is easy. Preferably, the contact region is higher in impurity doping density than the channel region. With this arrangement, the resistance value of the contact region is lowered, and applying the channel with the voltage is thus facilitated.

In the present invention, preferably, the light shielding layer overlaps the transistor. By shielding the transistor from above from a light ray, a transistor leakage current arising from light is prevented.

In the present invention, the semiconductor device of the present invention, having a semiconductor layer formed on an insulator, includes a P-channel-type transistor and an N-channel-type transistor, each transistor having at least a channel region formed in the semiconductor layer, a first light shielding layer for shielding the P-channel-type transistor from a light ray, and a second light shielding layer for shielding the N-channel-type transistor from a light ray, wherein the first light shielding layer and the second light shielding layer are separately arranged, and wherein the first shielding layer is electrically connected to the channel region of the P-channel-type transistor and the second shielding layer is electrically connected to the channel region of the N-channel-type transistor. In accordance with the present invention, the light shielding layer shields the transistor from a light ray, preventing the transistor from erratically operating due to a leakage current arising from light, and thereby stabilizing the potential of the channel in each of the complementary transistors. Since the potential is applied to the channel of the transistor, the effect of a floating substrate is thus controlled by draining an excess carrier (charge) accumulated in the channel to the light shielding layer. The withstanding voltage of each of the complementary transistors is thus improved, and kinks in the current-voltage characteristics of the transistor are thus controlled. Since the light shielding layer for the P-channel and the light shield layer for the N-channel are separately arranged, the channels of the complementary transistors may be applied with different potentials.

In the present invention, preferably, the first light shielding layer is supplied with a high power source potential and the second light shielding layer is supplied with a low power source potential. The channel of the P-channel transistor is supplied with the high power source potential through the first light shielding layer, and the excess carrier (charge) is thus efficiently drained. The channel of the N-channel transistor is applied with the low power source potential through the second light shielding layer, and the excess carrier (charge) is thus efficiently drained.

In the present invention, preferably, the semiconductor layers in the channel regions of the P-channel-type transistor and the N-channel-type transistor extend and form respective contact regions of the same respective conductive types, and the contact regions are electrically connected to the respective light shielding layers. Rather than arranging a contact hole for charge draining immediately on top of or beneath the channel region, the semiconductor layer of the channel region is extended to connect to the light shielding layer. The film thickness of the channel remains unchanged and the switching operation of the transistor is not affected. Furthermore, since the contact region is constructed of the same conductive type as that of the channel, supplying the channel with the potential is easy.

In the present invention, preferably, the P-channel-type transistor and the N-channel-type transistor form a driving circuit for an electro-optical device. The use of the semiconductor device of the present invention in the driving circuit allows the high-speed operation of the driving circuit to be stabilized. Heat generated in the high-speed operation may be dissipated through the light shielding layer.

To resolve the above-referenced problems, in the substrate for an electro-optical device of the present invention in which a transistor is arranged for each pixel area of a matrix of a plurality of pixel areas formed on the substrate, a semiconductor layer which becomes a channel region for the transistor is formed on the substrate, and the semiconductor layer which becomes the channel region shields the transistor from a light ray and is electrically connected to a light shielding layer applied with a predetermined potential. In accordance with the present invention, the light shielding layer shields the transistor from a light ray, preventing the transistor from erratically operating due to a leakage current arising from light, and thereby stabilizing the potential of the channel. Since a video signal having a particularly large amplitude voltage is applied between the source and the drain of the transistor of a pixel, an excess carrier (charge) is likely to be accumulated in the channel. The excess carrier is canceled by the potential applied through the light shielding layer. The transistor withstanding voltage is heightened, and the switching operation of the transistor is stabilized. With the active area of the semiconductor layer connected to the light shielding layer, heat generated in the transistor may be dissipated through the light shielding layer. Particularly when the semiconductor layer is a monocrystalline silicon layer, the charge mobility is high, which likely generates heat, and a heat dissipation step is thus required.

In the present invention, preferably, the transistor is an N-channel-type transistor and the light shielding layer is applied with a potential equal to or lower than the potential of a video signal supplied to the transistor. In the N-channel-type transistor, the charge is accumulated in its channel region in response to the video signal applied to the source and drain. By applying the low power source voltage equal to or lower than the video signal, the excess carrier (charge) is efficiently drained and the potential of the channel is thus stabilized.

In the present invention, preferably, the transistor is a P-channel-type transistor and the light shielding layer is applied with a potential equal to or higher than the potential of a video signal supplied to the transistor. In the P-channel-type transistor, the charge is accumulated in its channel region in response to the video signal applied to the source and drain. By applying the high power source potential equal to or higher than the video signal, the excess carrier (charge) is efficiently drained and the potential of the channel is thus stabilized.

In the present invention, preferably, the transistor is an N-channel-type transistor and the light shielding layer is applied with a deselection potential of a scanning signal that controls the N-channel-type transistor for a conductive state and a non-conductive state. The deselection potential is typically set to be a potential lower than the potential of the video signal to turn the N-channel-type transistor off, and the use of the deselection potential eliminates the need for an extra power source voltage.

In the present invention, preferably, the transistor is a P-channel-type transistor and the light shielding layer is applied with a deselection potential of a scanning signal that controls the P-channel-type transistor for a conductive state and a non-conductive state. The deselection potential is typically set to be a potential higher than the potential of the video signal to turn the P-channel-type transistor off, and the use of the deselection potential eliminates the need for an extra power source voltage.

In the present invention, preferably, the semiconductor layer in the channel region of the transistor extends and forms a contact region of the same conductive type, and the contact region is electrically connected to the light shielding layer. Rather than arranging a contact hole for charge draining immediately on top of or beneath the channel region, the semiconductor layer of the channel region is extended to connect to the light shielding layer. The film thickness of the channel remains unchanged and the switching operation of the transistor is not affected. Furthermore, since the contact region is constructed of the same conductive type as that of the channel, applying the channel with the potential is easy. Preferably, the contact region is higher in impurity doping density than the channel region. With this arrangement, the resistance value of the contact region is lowered, and applying the channel with the potential is thus facilitated.

In the present invention, preferably, the light shielding layer overlaps in a plane, a scanning line with which a scanning signal for controlling the transistor for a conductive state and a non-conductive state is applied. With the light shielding layer formed on top of the scanning line, the area other than the light shielding layer is made light transmissive, and a high aperture ratio device is thus provided.

In the present invention, preferably, a further light shielding layer extends in a plane over the substrate side of the semiconductor layer, to become the channel region of the transistor. Since the transistor is sandwiched between the light shielding layers from above and from below, the transistor is shielded from incident light rays from above and from below the substrate.

In the present invention, preferably, a peripheral circuit is arranged on the substrate surrounding the pixel area, and the semiconductor layer to become the channel region of the transistor forming the peripheral circuit is electrically connected to the light shielding layer that shields the transistor from a light ray. By incorporating the same step not only in the pixel area but also in the peripheral circuit, the overall reliability of the electro-optical device is enhanced.

In the present invention, preferably, the substrate for an electro-optical device includes the peripheral circuit including a P-channel-type transistor and an N-channel-type transistor, a first light shielding layer for shielding the P-channel-type transistor from a light ray, and a second light shielding layer for shielding the N-channel-type transistor from a light ray, wherein the first light shielding layer and the second light shielding layer are separately arranged, and wherein the first shielding layer is electrically connected to the channel region of the P-channel-type transistor and the second light shielding layer is electrically connected to the channel region of the N-channel-type transistor. The same step is incorporated even when the peripheral circuit is composed of complementary transistors, and the overall reliability of the electro-optical device is enhanced.

In the present invention, preferably, the light shielding layer of the pixel area and the light shielding layer of the peripheral circuit are formed of the same layer. Preferably, the light shielding layer of the pixel area and an interconnection layer of the peripheral circuit are formed of the same layer. With this arrangement, no extra interconnection layer is required in and out of the pixel area.

In the present invention, preferably, the transistor of the pixel area is an N-channel-type transistor, and the light shielding layer of the pixel area and the light shielding layer of the N-channel-type transistor in the peripheral circuit are applied with ground potential. If the number of N-channel transistors is predominant in the electro-optical device, the channels of the N-channel-type transistors are preferably connected to ground potential to reliably operate the predominant number of N-channel-type transistors.

In the present invention, preferably, the transistor of the pixel area is a P-channel-type transistor, and the light shielding layer of the pixel area and the light shielding layer of the P-channel-type transistor in the peripheral circuit are supplied with ground potential. If the number of P-channel transistors is predominant in the electro-optical device, the channels of the P-channel-type transistors are preferably connected to ground potential to reliably operate the predominant number of P-channel-type transistors.

In the present invention, the substrate is formed of an insulating material, the substrate is formed of a quartz substrate, or the substrate is formed of a glass substrate. The present invention presents a technique that is suitable for use in the SOI substrate that forms a semiconductor layer on an insulator.

The electro-optical device of the present invention includes a substrate for an electro-optical device and an opposing substrate, wherein the substrate and the opposing substrate are separated by a sealed-in electro-optical material. The electro-optical device employing a high-performance transistor, such as an active matrix type liquid-crystal panel, is thus provided. The electro-optical device is incorporated in any of a transmissive type and a reflective type, depending on a material selected for a pixel electrode.

Since the electronic equipment of the present invention employs the above-referenced electro-optical device as a display device, a highly reliable display device is thus presented.

The projection display apparatus of the present invention includes a light source, an electro-optical device for modulating a light beam from the light source, and projection optical device for projecting the light beam modulated by the electro-optical device. The electro-optical device of the present invention is suitable for use as a light valve for a projection display apparatus in which a powerful light source illuminates the electro-optical device.

BRIEF DESCRIPTION DRAWINGS

Figure 1:
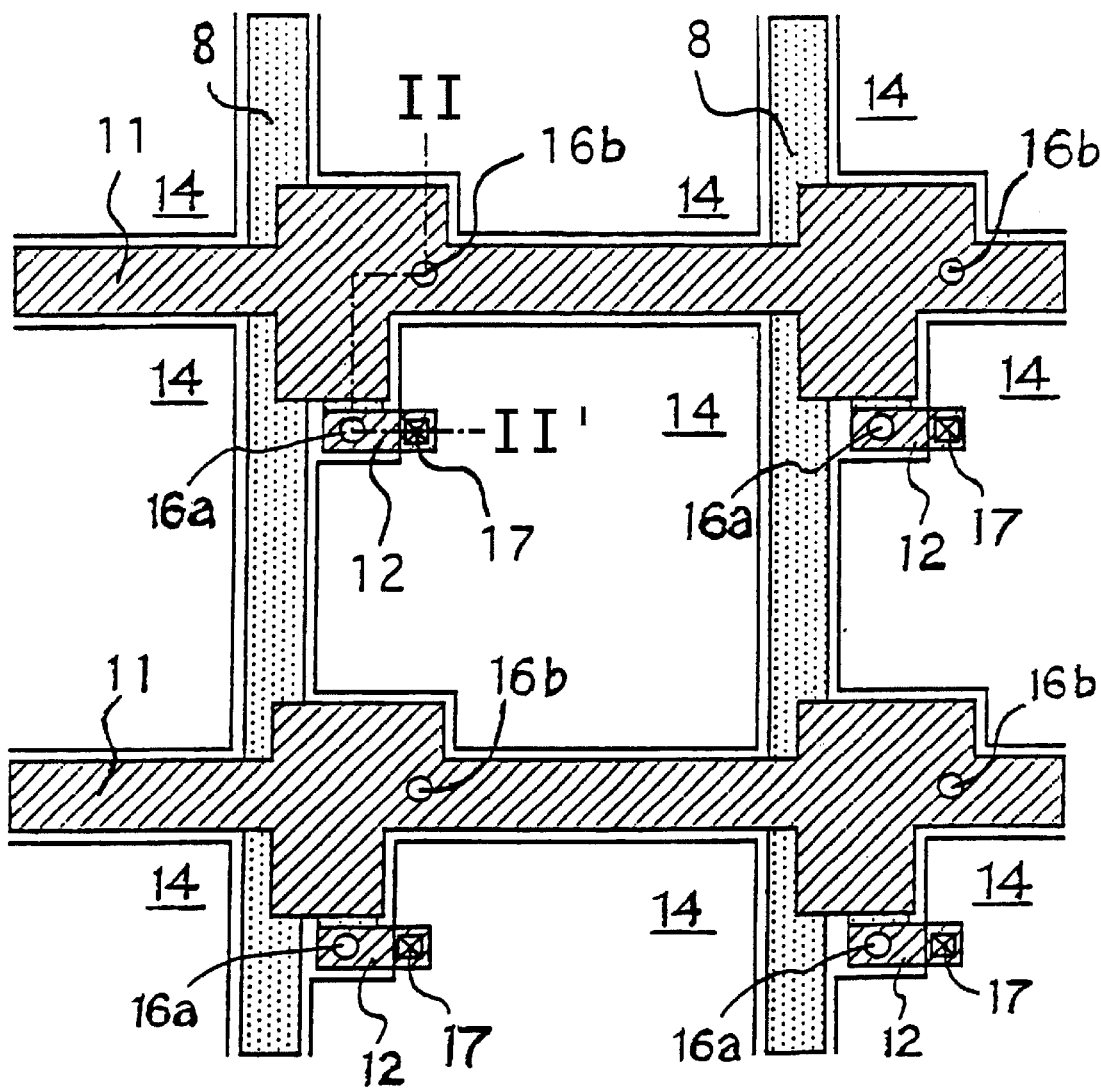
FIG. 1 is a plan view showing a pixel area of a substrate of a liquid-crystal display panel in accordance with a first embodiment of the present invention.

FIGS. 14(A)–(C) show a quick sketch of electronic equipment of the present invention.

DETAILED DESCRIPTION OF THE EMBODIMENT

Referring to the drawings, the preferred embodiments of the present invention are discussed.

(First Embodiment)

A first embodiment is a liquid-crystal display panel as one example of the substrate of an electro-optical device. This embodiment is discussed in connection with the substrate of the electro-optical device employing an SOI substrate in which a semiconductor layer is formed on an insulator. In each of the following embodiments, the substrate of the electro-optical device having a MOSFET formed on an insulator is discussed as one example of a semiconductor device of the present invention.

Figure 2:
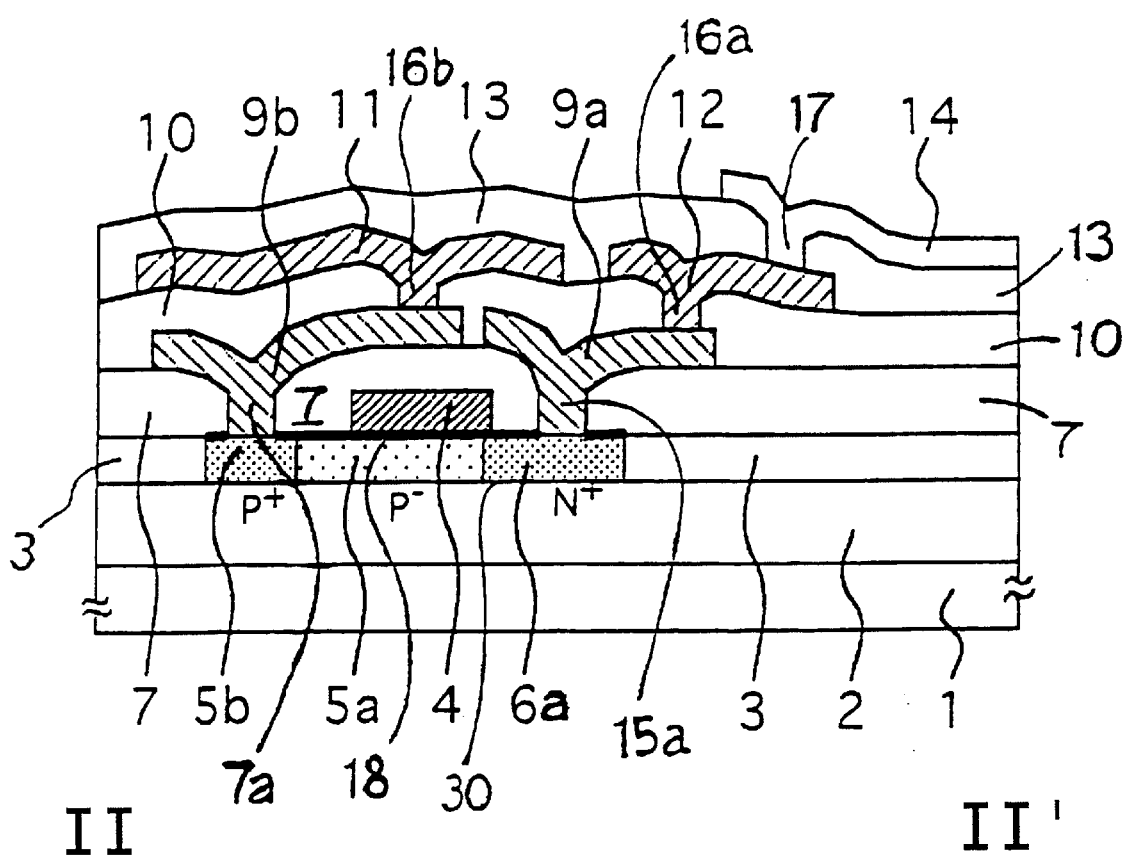
FIG. 2 is a cross-sectional view showing a section taken along II–II' in FIG. 1.
Figure 3:
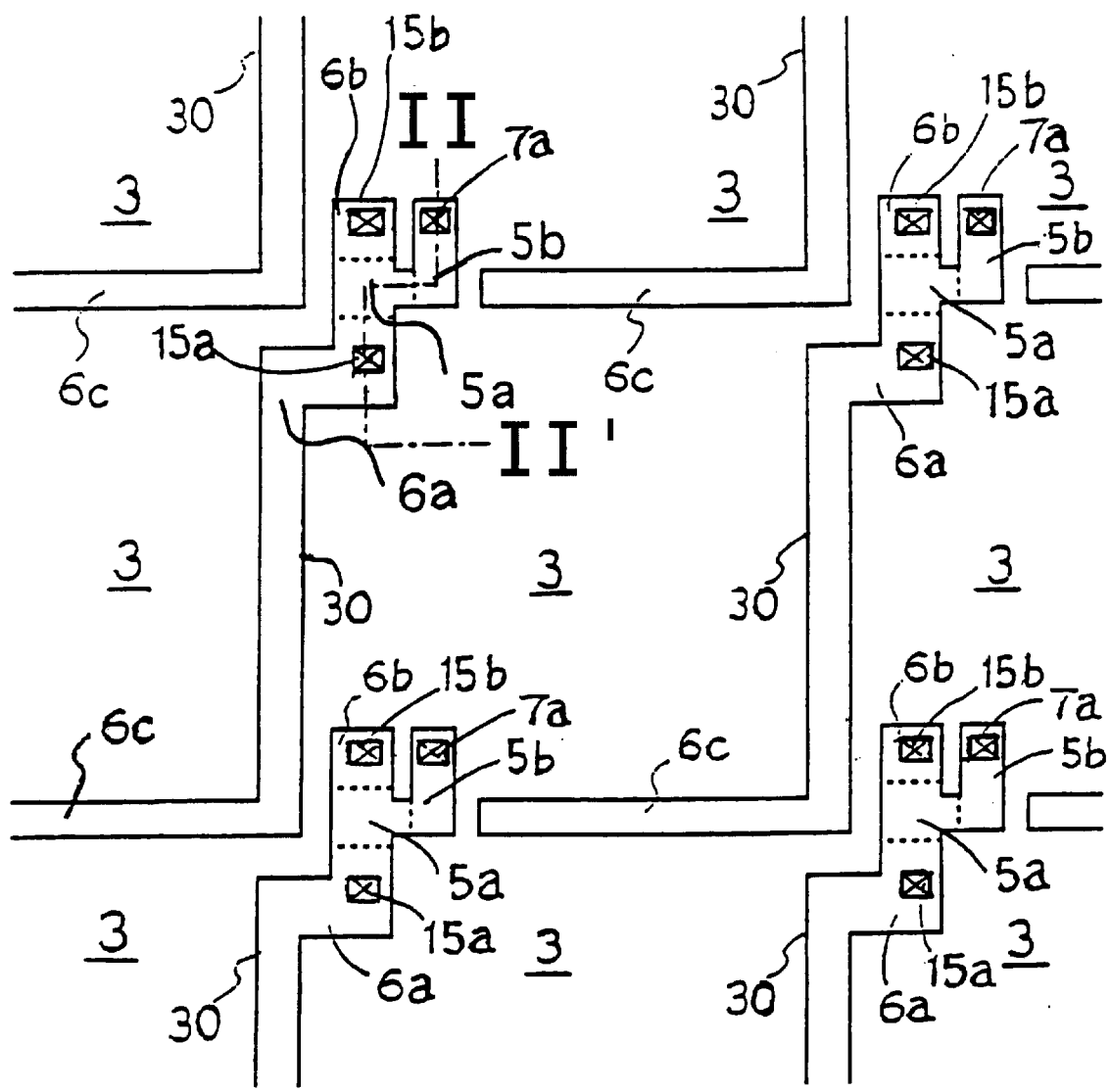
FIG. 3 is a plan view showing the layout of an active area of the semiconductor layer of the pixel area of the liquid-crystal panel substrate in accordance with the first embodiment of the present invention.
Figure 4:
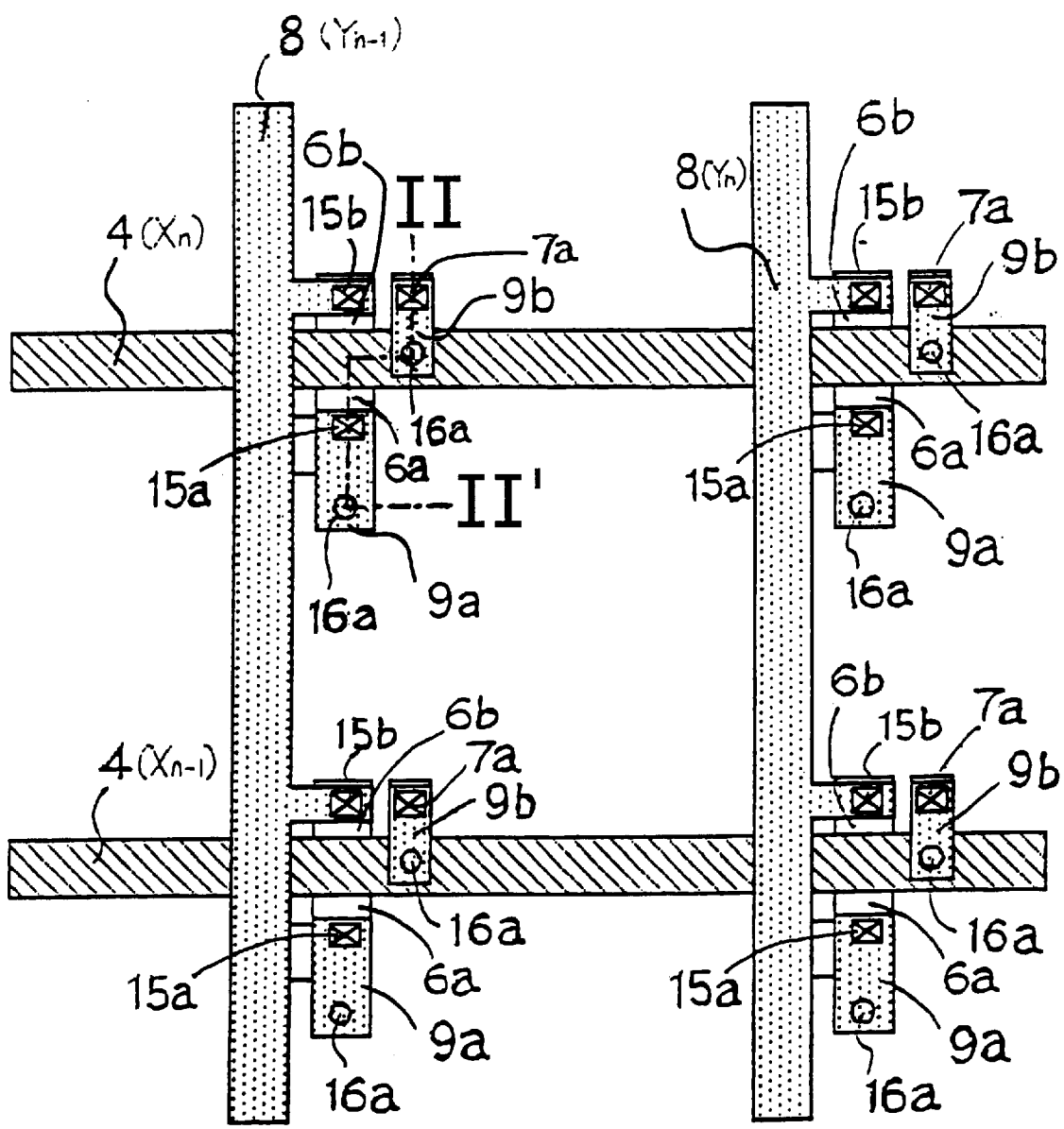
FIG. 4 is a plan view of the pixel area of the liquid-crystal panel substrate, from a semiconductor layer to an aluminum layer, in accordance with each embodiment of the present invention.

FIG. 1 is a plan view showing the layout of each layer in a pixel area in the liquid-crystal panel substrate of this embodiment. FIG. 3 is a plan view showing the layout of a semiconductor layer (monocrystalline silicon layer) in the pixel area in the liquid-crystal panel of this embodiment. FIG. 4 is a plan view showing the layout of the semiconductor layer (monocrystalline silicon layer), a polycrystalline silicon layer and an aluminum layer, in the pixel area in the liquid-crystal panel of this embodiment. FIG. 2 is a cross-sectional view showing a section, taken along a dotted line drawn along II–II' in FIG. 1. FIG. 3 and FIG. 4 show dotted lines II–II' corresponding to the section shown in FIG. 2.

Arranged in the substrate for the liquid-crystal panel are a plurality of scanning lines, a plurality of data lines that intersect the scanning lines in a matrix configuration, and, in the vicinity of each intersection, a MOSFET with its gate connected to a scanning signal line, its source connected to a video signal line, and its drain connected to a pixel electrode. The MOSFET includes the source, drain and channel formed in a semiconductor layer (silicon layer) formed on an insulating substrate having light transmissivity, such as glass. The pixel electrode is arranged in an aperture opened in a pixel area that is formed at the intersection of one scanning line and one data line. The display pixel area is formed of this matrix structure.

Referring to FIG. 1, there is shown a data line 8 extending vertically (in the direction of columns) in the display pixel area. A light shielding layer 11 horizontally (in the direction of rows) extends over and across the data line 8, with an insulating film interposed therebetween. A MOSFET is arranged beneath the portion of the light shielding layer 11 having a wider dimension across. As will be discussed later, the scanning line horizontally (in the direction of rows) extends beneath and along the light shielding layer 11. The semiconductor layer serving as the drain region of the MOSFET is connected to a conductive layer 12 via a contact hole 16a that is opened in an insulating film formed on the semiconductor layer, and the conductive layer 12 is, in turn, connected to a pixel electrode 14 via a contact hole 17 that is opened in an insulating film on the conductive layer 12. The pixel electrode 14 is arranged in an aperture that is defined by a grid constituted by the light shielding layers 11 and the data lines 8.

Referring to FIG. 2, which shows the section along II–II' in FIG. 1, the structure of the substrate in cross section is discussed. Referring to FIG. 2, there are shown a transparent insulating support substrate 1 having light transmissivity, such as quartz glass or OA glass, an embedded insulating film 2 of silicon dioxide formed on the substrate 1, and semiconductor layer portions 3, 5a, 5b, and 6a. The semiconductor layer portion 3, among these semiconductor layer portions, serves the purpose of element isolation. In this embodiment, the semiconductor layer is formed of a monocrystalline silicon layer that is laminated using a known SOI technique. Specifically, the support substrate 1 having the insulating film 2 thereon and a monocrystalline silicon substrate having the insulating film 2 thereon are laminated by heating them, and the semiconductor layer is left with the silicon substrate peeled or etched to form the monocrystalline silicon layer on the insulating film 2. By selectively oxidizing a non-element area (non-FET forming area) of the monocrystalline silicon layer, a field oxide film (so-called LOCOS) 3 for element isolation is formed. The portion of the semiconductor layer surrounded by the field oxide film 3 (semiconductor layer portion 3) becomes an active area 30.

A gate insulating film 18 made of silicon dioxide is formed on top of the monocrystalline silicon layer, and a gate electrode 4 serving as the scanning line is formed of polycrystalline silicon, on top of the gate insulating film 18. The gate insulating film 18 is constructed of a silicon oxide film. In this embodiment, this silicon oxide film is manufactured using LTO (Low Temperature Oxide) technique. This insulating film may be a thermal oxide film which is formed by thermally oxidizing the surface of the monocrystalline silicon layer or a nitride film deposited on the monocrystalline silicon layer. A plurality of layers may be laminated into the insulating film. A conductive layer, serving as the gate electrode 4, is constructed of a polycrystalline silicon layer, but, alternatively, is a silicide structure in which a refractory metal is laminated on polycrystalline silicon.

In this way, the MOSFET includes source and drain regions 6a and 6b, a channel region 5a, the gate insulating film 18, and the gate electrode 4. Like this embodiment, the FET that is constructed of thin film layers formed on the insulator is called a thin-film transistor (TFT).

Referring to FIG. 3, which shows the layout of the semiconductor layer, the pattern of the active area 30 formed on the substrate is now discussed. The pattern of the active area 30 includes regions 6a, 6b, 5a and 5b surrounded by the field oxide film 3. Specifically, since the active areas 30 are partitioned from one another by the field oxide film 3 made of the monocrystalline silicon layer, an element area (active area) 30 of the MOSFET is electrically fully isolated from another element area (active area) 30. As will be discussed in detail later, the MOSFET is constructed of 5a as the channel region, 6a as the drain region, and 6b as the source region formed in the active area 30. Furthermore, a capacitor electrode 6c and a contact region 5b are also formed in the active area 30. To arrange the MOSFET in each pixel as an N-channel-type transistor in this embodiment, the source region 6b, the drain region 6a, and the capacitor electrode 6c are constructed of an N-type semiconductor, and the channel region 5a and the contact region 5b are constructed of a P-type semiconductor. To this end, monocrystalline silicon layers are doped with respective impurities, and these impurities are activated to form the active areas.

Returning to FIG. 2, because this embodiment employs the N-channel-type transistor for each pixel, the P-type semiconductor region lightly doped with a P-type impurity needs to be formed in the channel region 5a before the formation of the gate electrode 4. Formed in the monocrystalline silicon layers on both sides of the channel region 5a are the source region 6b and the drain region 6a, both of which are N-type diffusion layers which are more heavily doped with an N-type impurity than the channel region 5a.

The source region 6b and the capacitor electrode 6c are not shown in FIG. 2. As shown in FIG. 2, although the channel region 5a and the contact region 5b connected to it are constructed of the same P-type semiconductor layer, the contact region 5b is more heavily doped. The unshown capacitor electrode 6c is an extended portion of the drain region 6a, and is doped with the same impurity at the same level of doping as the drain region 6a. In doping the semiconductor layer with impurities to the active area, any of the following tow methods are acceptable: in one method, after the formation of the gate insulating film 18, the entire active area 30 is doped with the impurity corresponding to that of the channel region 5a, and then other regions are doped with the respective impurities at the respective doping levels, and then the gate electrode 4 is formed; and in another method, after the formation of the gate insulating film 18, the entire active area 30 is doped with at the same doping level as that of the channel region 5a, the gate electrode is formed, and then other regions are doped with the respective impurities at the respective doping levels.

Next, an insulating film 7 such as BPSG (Boron Phosphorous Silica Glass) is formed on top of the gate insulating film 18 and the gate electrode 4, on the semiconductor layer of the active area 30 composed of the source region 6b, drain region 6a, channel region 5a, and contact region 5b. The data line 8 (see FIG. 1 and FIG. 4) constructed of a first aluminum layer is formed on the insulating film 7. The position of the data line 8 is two-dimensionally shown in FIG. 1. FIG. 4 shows the connection of the data line 8 and the semiconductor layer, wherein part of the data line 8 is electrically connected to the source region 6b via a contact hole 15b formed in the insulating film 7 interposed between the aluminum layer of the data line and the drain region 6b. FIG. 3 shows the relationship between the source region 6b and the contact hole 15b.

Referring to FIG. 2, a first extension wiring 9a and a second extension wiring 9b are formed of a first aluminum layer, constructed of the same layer as the data line 8, above the MOSFET. The first extension wiring 9a is electrically connected to the drain region 6a via a contact hole 15a formed in the insulating film 7, and the second extension wiring 9b is electrically connected to the contact region 5b via a contact hole 7a formed in the insulating film 7.

An insulating film 10, constructed of a laminate of a planarization film such as an SOG (Spin On Glass) film and an LTO (Low Temperature Oxide) film, is formed on the first and second extension wirings 9a and 9b.

The light shielding layer 11 and a third extension wiring, constructed of a second aluminum layer, are formed on top of the insulating film 10. The light shielding layer 11 is electrically connected to the second extension wiring 9b of the first aluminum layer, via a contact hole 16b formed in the insulating film 10. The third extension wiring 12 is electrically connected to the first extension wiring 9a via the contact hole 16a formed in the insulating film 10.

An insulating film 13, such as a passivation film of silicon nitride, is formed on the light shielding layer 11 and the third extension wiring 12. The third extension wiring 12 is electrically connected to the pixel electrode 14 of a transparent conductive film, such as ITO (Indium Tin Oxide), formed above the third extension wiring 12, via a contact hole 17 formed in the insulating film 13. Although it is not shown, an alignment layer for determining the alignment of liquid-crystal molecules is formed on top of the ITO, and the alignment layer is subjected to a rubbing operation to determine the alignment of the liquid crystal.

In the structure discussed, the MOSFET is fabricated on the substrate with the gate electrode 4 electrically connected to a scanning line 4, one of the source and drain regions 6b electrically connected to the data line 8, and another 6a electrically connected to the pixel electrode 14. The other 6a of the source and drain regions of the MOSFET is electrically connected to the pixel electrode 14 via the contact hole 15a, first extension wiring 9a, contact hole 16a, third extension wiring 12, and contact hole 17. The one 6b of the source and drain regions extends to form the capacitor electrode 6c. As will be discussed later, the capacitor electrode 6c is the electrode of a storage capacitor for storing the voltage which the data line 8 applies to the pixel electrode 14 via the MOSFET. In the storage capacitor, the electrode opposed to the capacitor electrode 6c is the next stage scanning line 4 adjacent to it. This scanning line 4 is the one that was already selected one horizontal scanning period earlier and is applied with the deselection potential in the current horizontal scanning period. The contact region 5b, which extends from the channel region 5a, is of the same conductive type as that of the channel region 5a, and is doped at a higher doping density. The contact region 5b is electrically connected to the light shielding layer 11 through the contact hole 7a, second extension wiring 9b, and contact hole 16b.

In this and subsequent embodiments, the source region and the drain region are interchangeable, 6b working as the drain region and 6a working as the source region. In the following discussion, however, 6b is treated as the source region and 6a is treated as the drain region.

This embodiment has been discussed in connection with the N-channel-type transistor for the MOSFET arranged in each pixel. The construction remains unchanged even if the P-channel-type transistor is substituted for the N-channel-type transistor. However, in the P-channel-type transistor, the source and drain regions 6a and 6b and the capacitor electrode 6c are heavily doped with the P-type impurity, the channel region 5a is lightly doped with the N-type impurity, and the contact region 5b is more heavily doped with the N-type impurity than the channel region 5a.

The above-cited storage capacitance (holding capacitance) is now discussed.

Referring to FIG. 3, the drain region 6a extends immediately below the preceding stage scanning line 4 (the interconnection layer electrically connected to the gate electrode 4, and runs beneath the interconnection layer 11 in the same direction as shown in FIG. 1. The interconnection layer is constructed of the same layer as the scanning line 4), and forms the capacitor electrode 6c. The capacitor electrode 6c shown in FIG. 3 is positioned immediately below the preceding stage scanning line 4 shown in FIG. 4. The preceding stage scanning line is the scanning line that was applied with a selection potential earlier than a scanning line that is applied with the selection potential. Specifically, the preceding stage scanning line is applied with the deselection potential when the current scanning line is at the selection potential. The capacitor electrode 6c and the preceding stage scanning line are stacked with the gate insulating film 18 interposed therebetween, and are of the same layer as the gate insulating film, thereby forming a holding capacitor. As is known in the art, the holding capacitor stores the charge written onto the pixel electrode 14 by the data line 8 via the MOSFET, for a deselection period during which the scanning line 4 is supplied with the deselection potential. Referring to FIG. 4, the scanning line 4 that also works as the gate electrode extends horizontally (in the direction of rows), intersecting the data line 8 that extends vertically (in the direction of columns) in the display pixel area. The drain region 6a of the MOSFET on the next column, in the subsequent pixel, extends beneath the scanning line 4 on the left column, in the preceding stage pixel, forming the capacitor.

The application of the voltage to the channel region 5a, one feature of the present invention, is now discussed.

As seen from FIG. 2 and FIG. 3, in this embodiment, for connection to a fixed potential, the channel region 5a lightly doped with the P-type impurity and the channel contact region 5b constructed of a P-type diffusion layer heavily doped with the P-type impurity are formed in the active area 30 of the monocrystalline silicon layer. The channel contact region 5b is an area that is in contact with the channel region 5a. As already discussed, the contact region 5b is electrically connected to the light shielding layer 11, shown in FIG. 1 and FIG. 2, via the contact hole (also referred to as a VIA hole) 7a formed in the insulating film 7, first extension wiring 9b of the first aluminum layer, and a contact hole (also referred to as a VIA hole) 16b formed in the insulating film 10.

The light shielding layer 11 is constructed of the second aluminum layer, and is connected to the first extension wiring 9b of the first aluminum layer through the VIA hole 16b formed in the insulating film 10, and part of the first extension wiring 9b of the first aluminum layer is electrically connected to the channel contact region 5b through the contact hole 7a formed in the insulating film 7. Since the MOSFET is the N-channel-type transistor in this embodiment, the light shielding layer 11 is supplied with the low power source voltage (preferably the ground potential) of a power source wiring arranged around the display pixel area, or is supplied with a potential equal to or lower than the minimum potential of the voltage fed to the data line 8 or the scanning line 4.

The potential of the light shielding layer 11 is fed to the P-channel-type region 5a of the N-channel-type MOSFET, thereby stabilizing the potential of the channel region 5a. Specifically, even if an excess current flows through the MOSFET when it is turned on, the current is discharged from the contact region 5b to the light shielding layer 11, protecting the MOSFET. Even if an excess charge (carrier) occurs in the channel region due to a potential difference between the source and the drain when the MOSFET is turned off, the charge is drained to the light shielding layer 11. The channel region of the MOSFET is thus continuously stabilized in potential, and the excess charge which could break down the MOSFET is not stored. The withstand voltage of the N-channel MOSFET is increased, and the current characteristics of the N-channel MOSFET are stabilized and improved. By connecting the semiconductor layers forming the source, the drain and the channel of the MOSFET to the light shielding layer extending from the pixel area, heat generated in the operation of the transistor is dissipated through the light shielding layer. Particularly, in such a case as in this embodiment that the semiconductor layers are monocrystalline silicon layers, the charge mobility is high, which likely generates heat in the semiconductor layers. In accordance with this embodiment, the heat generated is dissipated, and elements formed in the substrate are not subject to high temperatures and are prevented from erratically functioning.

Figure 5:
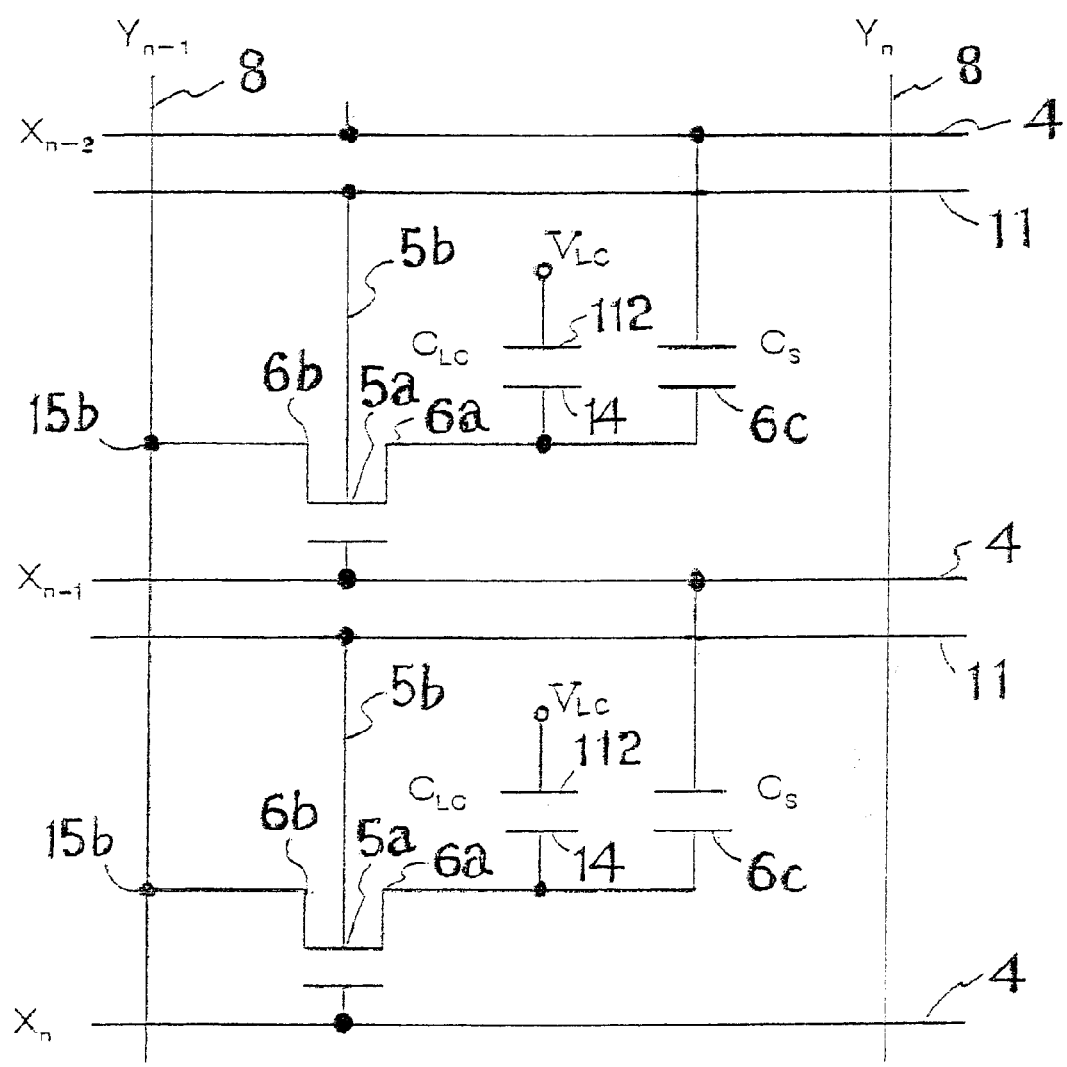
FIG. 5 is an equivalent circuit diagram of the pixel area of the liquid-crystal panel in accordance with each embodiment of the present invention.

Discussed next is the circuit arrangement of the display pixel area of the liquid-crystal panel that is constructed of the substrate for an electro-optical device of the above-referenced embodiment (liquid-crystal panel substrate) and an opposing substrate with a liquid crystal layer interposed therebetween. FIG. 5 is an equivalent circuit diagram showing two pixels, adjacent in the direction of columns, in the display pixel area of the liquid-crystal panel.

The liquid-crystal panel in the active matrix type liquid-crystal display device includes scanning lines 4 (Xn−2, Xn−1, Xn: n is an integer representing the order of selection) and video signal lines 8 (Yn−1, Yn), arranged on a matrix plane, and each intersection of both lines in the plane is provided with a MOSFET (TFT). The source 6b of the MOSFET is electrically connected to the data line 8 through the contact hole 15b, the gate electrode is electrically connected to the scanning line 4, and the drain 6a is electrically connected to the pixel electrode 14 and the capacitor electrode 6c. The pixel electrode 14 faces an opposing electrode 112 formed in the internal surface of the opposing substrate, with the liquid crystal layer interposed therebetween, and drives the liquid crystal between the two electrodes in alternating polarity driving. The opposing electrode 112 is applied with a common potential VLC that serves as a reference potential for alternating polarity driving, and the pixel electrode 14 and the opposing electrode 112 form a liquid crystal capacitance CLC with the liquid crystal layer as a dielectric. The capacitor electrode 6c forms a holding capacitance (storage capacitance) Cs with respect to the preceding stage scanning signal line 4 (the preceding stage scanning line Xn−1 referenced to pixel of Xn of the MOSFET). In other words, one pixel is constituted by the transistor, the capacitance of the liquid crystal connected to it and the holding capacitance.

The channel region 5a of the MOSFET is electrically connected to the light-shielding layer 11 that runs in parallel with the scanning line that drivings the MOSFET. Specifically, the channel region 5a of the MOSFET, the gate of which is connected to the scanning line 4 (Xn), is electrically connected to the light shielding layer 11 adjacent to it, and a fixed potential is fed to the channel region 5a through the contact region 5b. In other words, the floating substrate effect is controlled by draining the excess carrier present in the channel region 5a through the contact region 5b to the light shielding layer 11.

Figure 6:
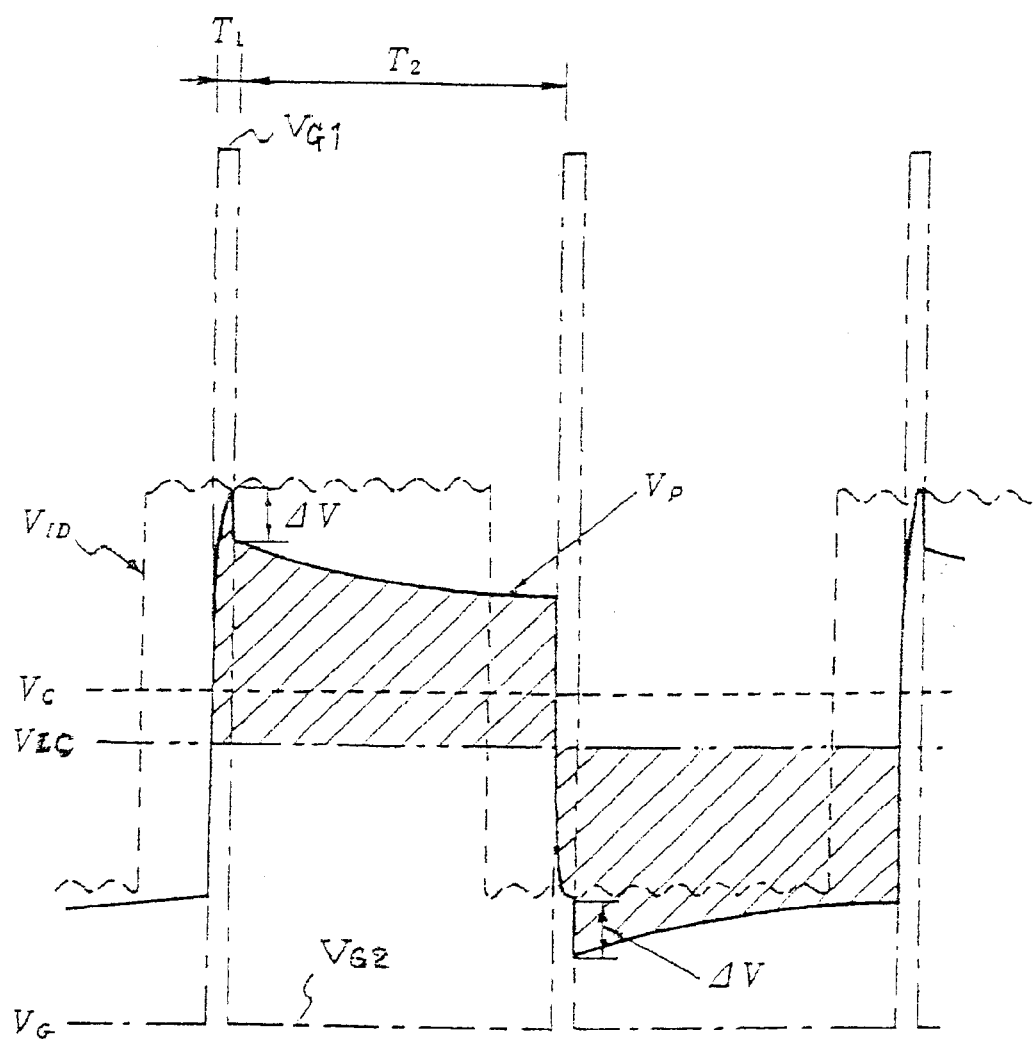
FIG. 6 is a waveform diagram of a driving voltage in the equivalent circuit diagram shown in FIG. 5.

The driving of the liquid-crystal panel and the application of the fixed potential to the channel region of the MOSFET are now discussed, referring to a driving timing diagram shown in FIG. 6.

VG represents the waveform of the scanning signal applied to the scanning line 4. At each selection period T1 in every vertical scanning period, the scanning signal becomes a selection potential VG1, turning on the N-channel-type MOSFET in this embodiment. In a subsequent deselection period T2, VG becomes a low-potential deselection potential VG2, turning off the MOSFET. Since a line-at-a-time scanning is employed, the subsequent scanning line 4 is applied with the selection potential immediately subsequent to the selection period T1, and these steps are repeated. VID presents the potential waveform of the video signal applied to the data line 8. Vc represents a central potential of VID. The video signal VID is reversed in polarity in its waveform with respect to the central potential Vc every vertical scanning period (frame or field). Vp represents a pixel electrode potential that results from the video signal VID which is applied from the video signal line 8 to the pixel electrode 14 through the N-channel-type MOSFET. VLC is the common potential applied to the opposing substrate 112. The common voltage VLC is set so that the pixel electrode voltage Vp reversed in polarity exhibits symmetry between the positive side and the negative side of its potential excursion. In this way, the voltage not one-sided into one polarity is applied to the liquid crystal in an alternating current driving manner to prevent the liquid crystal from degrading.

ΔV represents a voltage drop of the pixel electrode potential Vp due to the parasitic capacitance of the N-channel-type MOSFET. At the moment the selection period T1 ends, the charge is accumulated in the channel region 5a of the N-channel-type MOSFET, and is accumulated in the parasitic capacitance between the drain region 6a and the gate electrode (scanning line) 4. The charge flows to the drain side when the gate electrode is driven down to the deselection potential in the deselection period T2, and is applied to the pixel electrode 14. The pixel electrode potential Vp that has reached the same level as the data line 8 during the selection period T1 is dropped by ΔV, and the voltage applied to the liquid crystal layer thus drops. For this reason, VLC is shifted so that the pixel electrode potential Vp is symmetrical between the positive side and the negative side of its voltage excursion. However, the voltage written is not fully exploited, and the adjustment of VLC is rather difficult, and ΔV is preferably small to improve the display quality. To this end, the excess carrier stored in the channel needs to be minimized. In accordance with the present invention, the excess carrier is drained from the channel region. Since the MOSFET employs the channel region of the monocrystalline silicon with a high charge mobility, the excess carrier tends to reside when the MOSFET is turned off. With the present invention implemented, the display quality is improved.

Since this embodiment employs the N-channel-type MOSFET, a current caused by electrons (negative charges) flows through the channel region 5a when the video signal VID is transferred through the channel region. The potential of the light shielding layer 11 electrically connected to the channel region 5a is lower than the minimum potential of the video signal VID. For example, the deselection potential VG2 is preferably used as the potential for the light shielding layer 11, because this potential is lower than the minimum potential of the video signal VID, and because the power source potential within the liquid-crystal panel is shared. The potential of the light shielding layer 11 may be lower than the deselection potential VG2. If the potential of the light shielding layer 11 (and the deselection potential VG2 as well) is set to be the ground potential GND, the potential remains stable, and the potential of the channel region becomes even more stable. In this way, the potential of the light shielding layer 11 needs to be at least equal to or lower than the potential of the video signal VID.

In this embodiment, the holding capacitance Cs of each pixel is formed of the capacitor electrode 6c and the preceding stage scanning line 4 with the insulating film interposed between, but the present invention is not limited to this. For example, the holding capacitance Cs may be formed through the insulating film 18 between the capacitor electrode 6c and a succeeding scanning line 4 that faces the capacitor electrode 6c, wherein the capacitor electrode 6c is extended beneath the succeeding scanning line 4. Alternatively, a capacitive line is extended in parallel with the scanning line 4, at the same layer as the scanning line 4, the potential VLC shown in FIG. 6 is applied to the capacitive line, and a capacitor is formed of the capacitive line and the capacitor electrode 6c that faces the capacitive line with the insulating film 18 interposed therebetween. Alternatively, the capacitor electrode 6c is not used as the electrode of the capacitor, and the drain region 6a is connected to an electrode at another layer, and a capacitance is formed of that electrode and the scanning line or the capacitive electrode with an insulating film interposed therebetween. If the electrode of a capacitor is arranged above the semiconductor layers, that electrode may be used to form a capacitor with an interlayer insulating film between the light shielding layer 11 and the electrode. In any case, the advantage of the present invention is equally provided.

In this embodiment, the N-channel-type MOSFET is used. Even if the P-channel-type MOSFET (TFT) is substituted for the N-channel-type MOSFET, the same circuit, the same structure and the same pattern may be employed, and the resulting substrate has the same advantages. In this case, however, the signal potential in FIG. 6 are inverted in level from high to low, low to high, and the top portion shows low potential and the bottom portion shows high potential. The deselection potential VG2 applied to the light shielding layer 11 is equal to or higher than the maximum potential of the video signal VID, and is preferably the ground potential, and the channel region 5a of the P-channel-type MOSFET is thus applied with the potential higher than the video signal VID. In this way, the excess carrier in the channel region 5a of the P-channel-type MOSFET, through which a current caused by holes (positive charges) flows, is drained and the channel potential is thus stabilized.

The light shielding layer 11 overlaps at least the channel region 5a of the MOSFET to shield the MOSFET from a light ray, thereby controlling a leakage current due to light in the channel region 5a. The light shielding layer 11 also shields the channel contact region 5b that is of the same conductive type as that of the channel region 5a, thereby controlling a leakage current due to light in the channel contact region 5b. The light shielding layer 11 overlaps the scanning line 4 so that the aperture ratio of the liquid-crystal panel is not affected.

In accordance with this embodiment, the MOSFET, in which the transparent pixel electrode is supplied with the video signal from the data line, feeds the potential to the channel region using the light shielding layer formed on the top portion of the MOSFET. The potential fed to the channel region is determined in accordance with the conductive type of the MOSFET. The liquid-crystal display panel having a large aperture ratio in the pixel area is thus provided by employing the light shielding layer overlapping the scanning line as a wiring for feeding the potential to the channel region.

In the above discussion, the N-channel-type MOSFET is used. Alternatively, the different conductive type, namely, the P-channel-type MOSFET may be employed. In such a case, the channel region, channel contact region, source region and drain region are the other conductive type opposite to that in the above embodiment. The light shielding layer 11 is supplied with the high power source potential, or with the maximum potential of the voltage supplied to the data line 8 or the scanning line 4. The N-type channel region is thus stabilized.

(Second Embodiment)

In a second embodiment, as one example of the substrate of the electro-optical device of the present invention, a light shielding layer 20 is added to the construction of the first embodiment in connection with the liquid-crystal panel. In this embodiment, same numerals, already quoted in the discussion of the first embodiment represent layers manufactured at the same steps or members having identical functions unless otherwise particularly noted. The second embodiment is now discussed. Like the first embodiment, the second embodiment employs an SOI substrate as a substrate for an electro-optical device in which a semiconductor layer is formed on an insulator.

Figure 7:
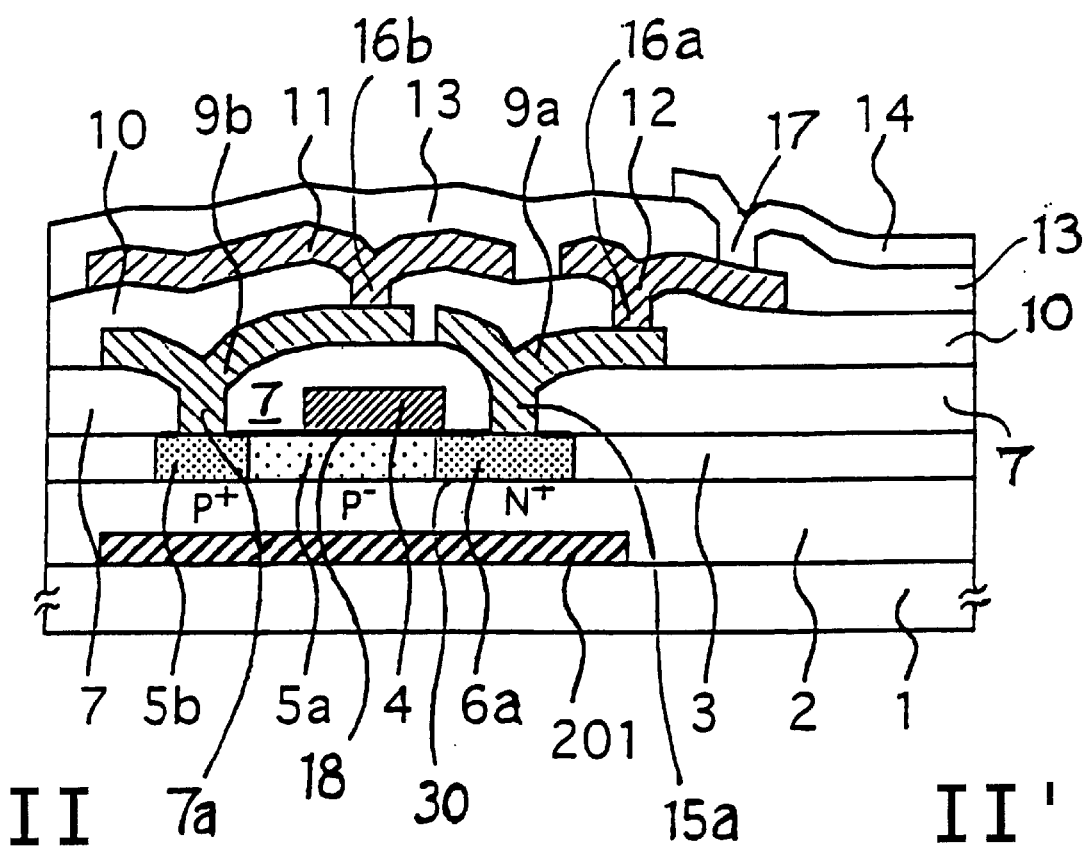
FIG. 7 is a cross-sectional view showing a section of a pixel area of a liquid-crystal panel substrate in accordance with a second embodiment of the present invention.
Figure 8:
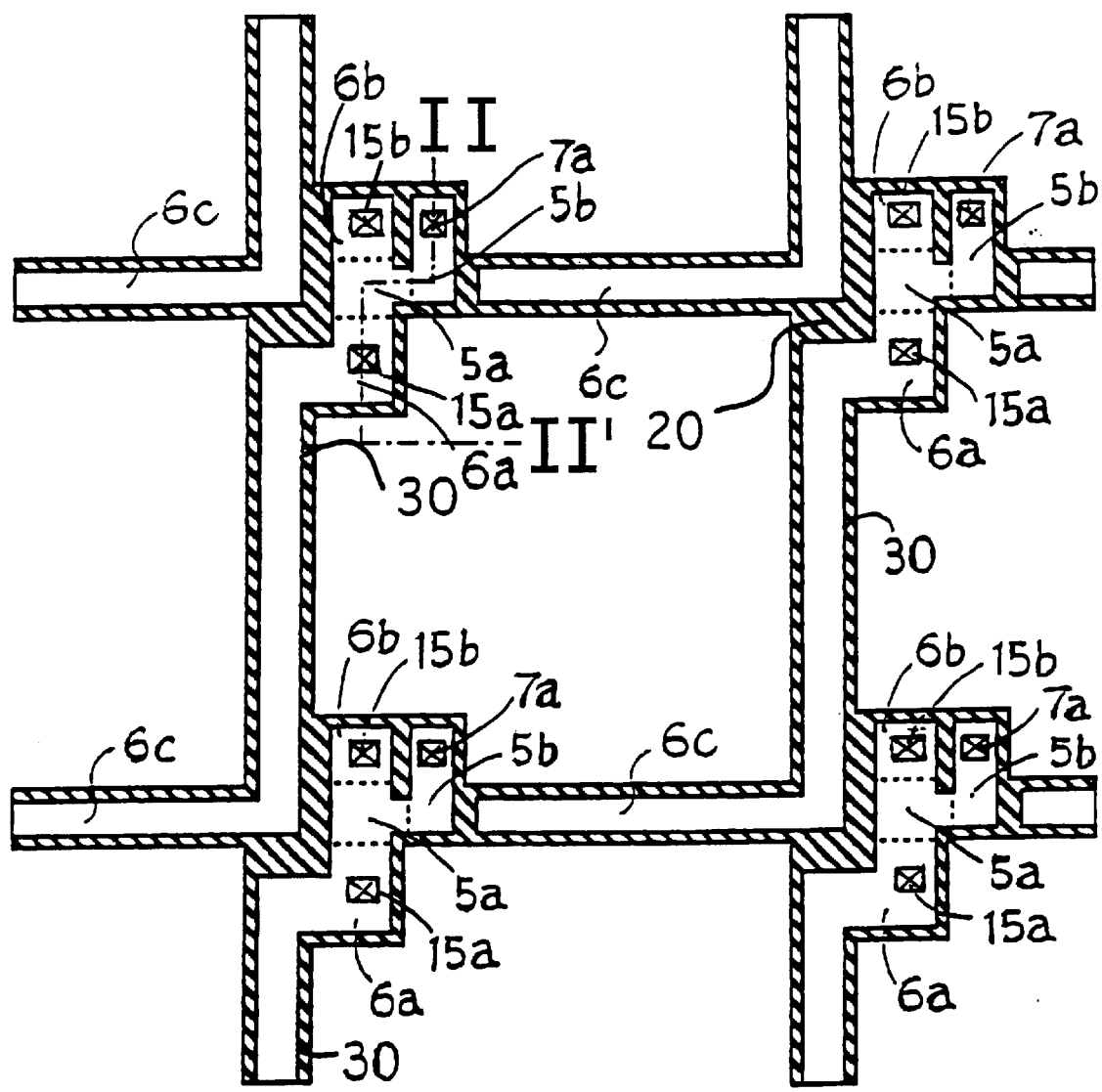
FIG. 8 is a plan view showing the layout of the active area of the semiconductor layer in the pixel area of the liquid-crystal panel substrate in accordance with the second embodiment of the present invention.

FIG. 7 is a cross-sectional view of a pixel area of the liquid-crystal panel substrate of this embodiment. FIG. 8 shows the layout of a first light shielding layer and a semiconductor layer (monocrystalline silicon layer) in the pixel area of the liquid-crystal panel substrate of this embodiment. In this embodiment, a plan view showing the layout of each layer in the pixel area in the liquid-crystal panel substrate and a plan view showing a semiconductor layer (monocrystalline silicon layer), a polycrystalline silicon layer, and a first aluminum layer in the pixel area in the liquid-crystal panel substrate are substantially identical to FIG. 1 and FIG. 4 in connection with the first embodiment. FIG. 7 and FIG. 8 respectively correspond to FIG. 2 and FIG. 3 in connection with the first embodiment. The section shown in FIG. 7 is the one taken along a line II–II' in each plan view.

Referring to FIG. 7, in this embodiment, an embedded light shielding layer (first light shielding layer) 20 made of a refractory metal selected from a group consisting of Mo, Cr, Ta, etc. is formed in an embedded insulating film 2. The embedded light shielding layer 20 is beforehand produced on a support substrate 1 using a known SOI manufacturing method, prior to a manufacturing step of laminating an active area 30 made of a monocrystalline silicon layer on the support substrate 1. The embedded light shielding layer 20 may be patterned prior to the lamination step or at an element isolation step for forming a field oxide film 3 in the monocrystalline silicon layer. The embedded light shielding layer 20 is also supplied with a predetermined potential at a peripheral portion of the display pixel area. Preferably, the potential identical to that at the light shielding layer 11 is fed to the embedded light shielding layer 20 to stabilize the operation of the MOSFET. When a contact hole can be formed in the insulating film 2, the contact region 5b extended from the channel region 5a of the MOSFET is electrically connected to the embedded light shielding layer 20, and the above-referenced potential is applied to the channel region via the embedded light shielding layer 20.

Referring to FIG. 8, the embedded light shielding layer 20 is formed on the substrate side of the active area 30 formed in the monocrystalline silicon layer, and coextends the entire portion of the active area 30 for light shielding. The structure of the MOSFET and the pixel electrode, subsequent to the element isolation step, remains unchanged from those in the above-referenced first embodiment.

As in the first embodiment, in accordance with the second embodiment, the MOSFET, in which the pixel electrode is fed with the video signal from the data line, the channel region is supplied with the potential through the light shielding layer that is formed on the top portion of the MOSFET, and the potential of the channel region is thus stabilized. Furthermore, the first light shielding layer prevents a reflective light ray and external light rays from entering the active area 30 in the liquid-crystal panel substrate from back (from below in FIG. 7). In this embodiment, as in the first embodiment, the P-channel-type MOSFET is substituted for the N-channel-type MOSFET. As in the first embodiment, the potential applied to the light shielding layers 11 and 20 is changed depending on whether the N-channel-type MOSFET or the P-channel-type MOSFET is employed.

The light shielding layer 20 may be used as an electrode for a holding capacitor. The holding capacitance in this case is formed through the insulating film 2 between the capacitor electrode 6c of the semiconductor layer and the light shielding layer 20.

(Embodiment of an Electro-optical Device of the Present Invention)

Now discussed referring to drawings is the construction of a liquid-crystal panel as one example of the electro-optical device constructed of the substrate of the electro-optical device of the present invention.

Figure 9:
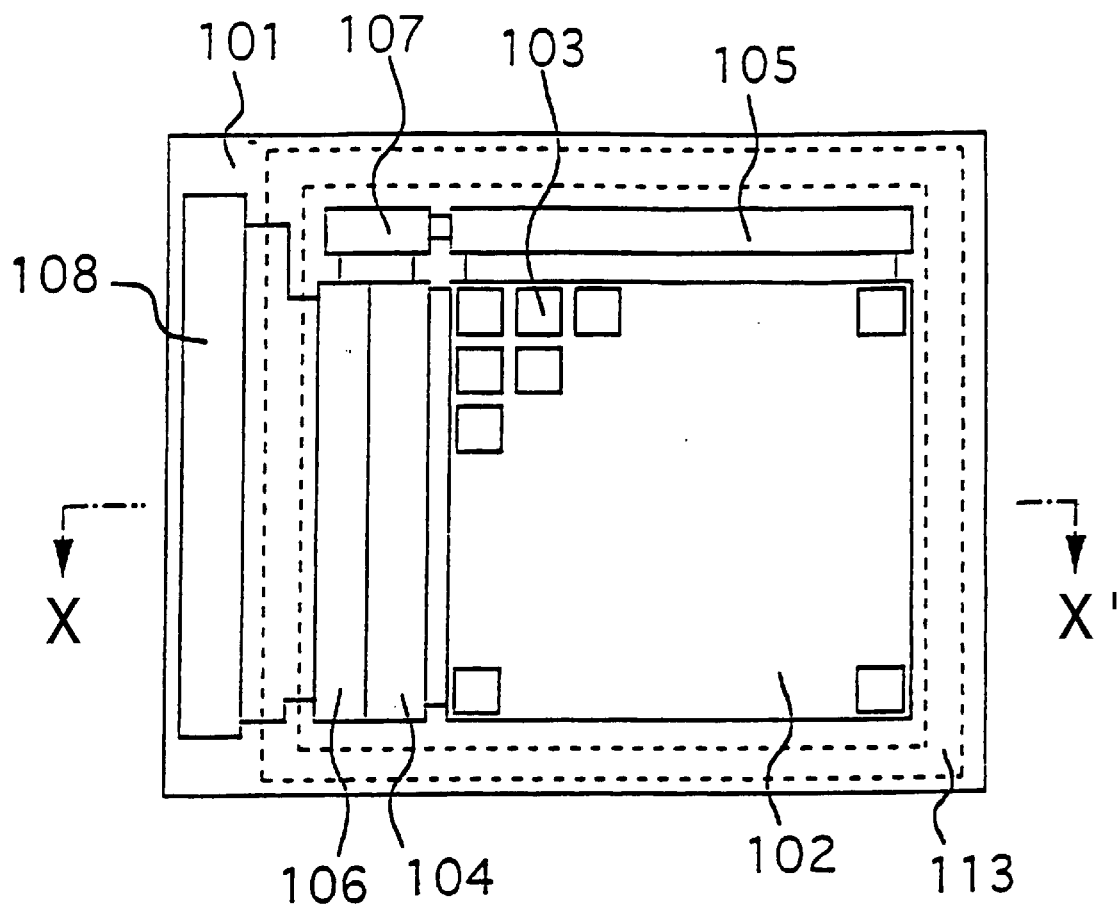
FIG. 9 is a plan view showing the liquid-crystal panel substrate of the present invention.

FIG. 9 is a plan view showing the layout of the entire substrate of a transmissive-type liquid-crystal panel in which the first and second embodiments are implemented. For convenience of explanation, FIG. 9 is schematically drawn with no detail provided.

Referring to FIG. 9, a display pixel area 102 is formed on a transparent substrate 101 (corresponding to the substrate 1 shown in FIG. 2 and FIG. 7), and pixel electrodes 103 (corresponding to the pixel electrode 14 shown in FIG. 1) are arranged in a matrix. Peripheral driving circuits 104 and 105 for processing display signals are arranged around the display pixel area 102 on the transparent substrate 101. A scanning line driving circuit 104 successively applies the selection potential VG1 and the deselection potential VG2 to the scanning lines for scanning. A data line driving circuit 105 supplies a data line with a video signal corresponding to video data. Also arranged on the transparent substrate 101 are an input circuit 106 for receiving the video data from the outside through a pad area 108, and a timing control circuit 107 for controlling these circuits. These circuits are a combination of load elements, such as resistors and capacitors, and the MOSFETs, as an active element or a switching element, which are manufactured at the same manufacturing step or different manufacturing step for the MOSFET for each pixel. Designated 113 is a formation area of a sealing material. The sealing material fills these areas to glue the liquid-crystal panel substrate of the present invention to the opposing substrate.

The light shielding layer 11, discussed in connection with the first and second embodiments, is constructed of the same aluminum interconnection layer which is also used in the above-referenced peripheral circuits (the scanning line driving circuit 104, data line driving circuit 105, timing control circuit 107, and input circuit 106). The light shielding layer 11 is supplied with the above-referenced predetermined potential at the peripheral circuit area. The embedded light shielding layer 20 is also supplied with the above-referenced predetermined potential at the peripheral circuit area. The embedded light shielding layer 20 is not only used for light shielding of the MOSFET in the peripheral circuit area, but also for an interconnection layer for interconnecting circuit elements and interconnecting a power source line to circuit elements.

Figure 10:
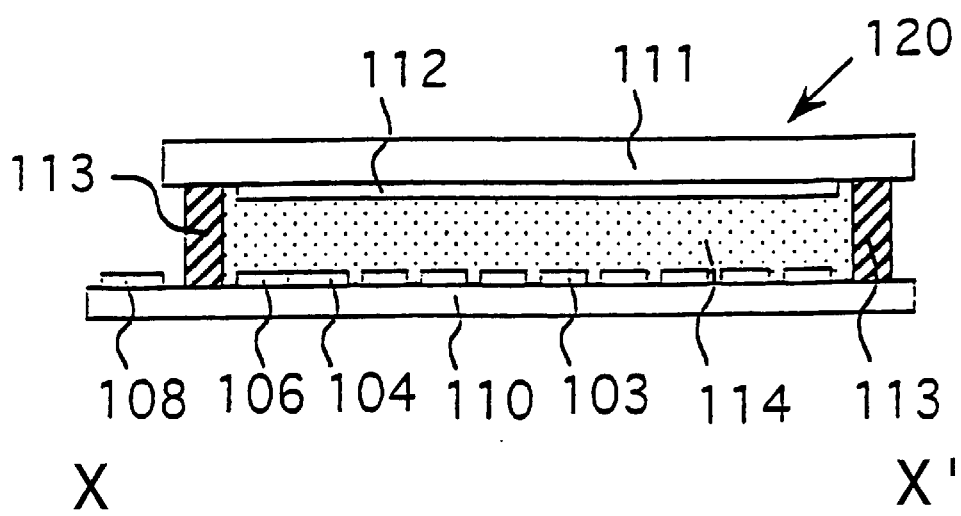
FIG. 10 is a cross-sectional view of the liquid-crystal panel of the present invention.

FIG. 10 is a cross-sectional view of the liquid-crystal panel taken along a line X–X' in FIG. 9. Referring to FIG. 10, in the liquid-crystal panel, the substrate (SOI substrate) 110 having the display pixels and the driving circuit thereon and the transparent substrate (opposing substrate) 111 having an opposing electrode 112 constructed of a transparent conductive film (ITO) to which the common potential VLC is applied, are assembled with a predetermined gap, and the gap which is closed by the sealing material 113 is filled with a known liquid crystal such as a TN (Twisted Nematic) type liquid crystal 114, a vertical alignment (Homeotropic) type liquid crystal in which liquid crystal molecules are aligned generally vertically with no voltage applied, a horizontal alignment (Homogeneous) type liquid crystal in which liquid crystal molecules are aligned generally horizontally without twist with no voltage applied, a ferroelectric liquid crystal or a polymer dispersed liquid crystal. A liquid-crystal panel 120 is thus constructed. To feed signals from outside, the position of the sealing material 113 is determined so that the pad area 108 is outside of the sealing material 113.

Discussed next is an embodiment in which the channel region in the MOSFET in the peripheral circuit is electrically connected to a light shielding layer for shielding the MOS-FET from light rays in the same manner described in connection with the above embodiments, in the above-referenced peripheral circuits (the scanning line driving circuit 104, data line driving circuit 105, timing control circuit 107, and input circuit 106) formed in the peripheral area in the substrate for the liquid-crystal panel of the embodiment.

Figure 11:
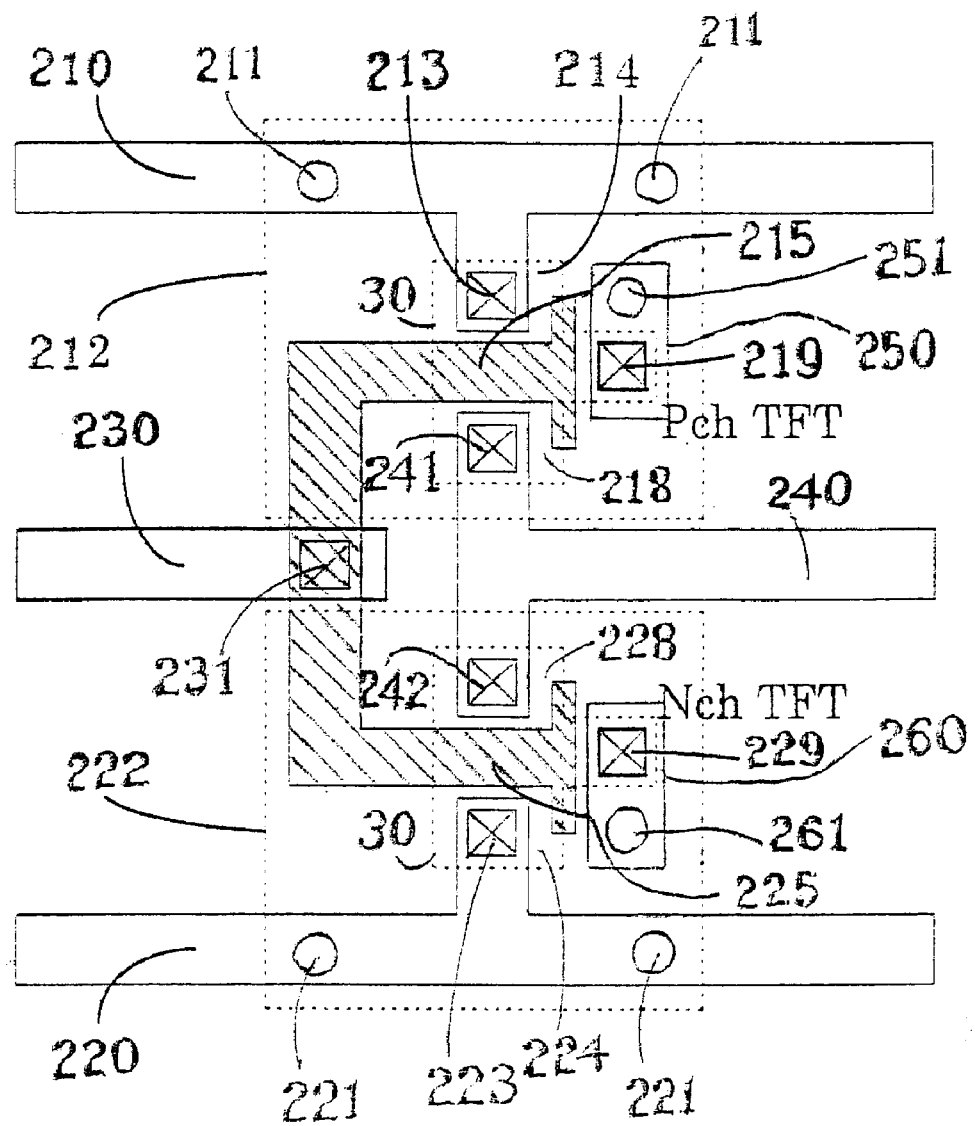
FIG. 11 is a plan view showing the layout of a complementary inverter forming a peripheral circuit of the present invention.

FIG. 11 is a plan view showing the layout of a complementary inverter forming the peripheral circuit. The complementary inverter is composed of a P-channel-type MOSFET (TFT) and an N-channel-type MOSFET (TFT). Referring to FIG. 11, a first power source line 210 constructed of a first aluminum layer feeds a high power source potential VDD, and a second power source line 220 constructed of the first aluminum layer feeds a lower power source potential VSS. There are also shown an input wiring 230 constructed of the first aluminum layer, and an output wiring 240 constructed of the first aluminum layer. There are also shown a gate electrode 215 of the P-channel-type MOSFET, and a gate electrode 225 of the N-channel-type MOSFET. These two gate electrodes are connected to each other, above them, via the same layer, and are connected to the input wiring 230 of the first aluminum layer via a contact hole 231 formed in a first interlayer insulating film.

The active areas 30 of the semiconductor layer (monocrystalline silicon layer) are separated in two lands (areas surrounded by dotted lines) on the substrate. In the active area 30 below the gate insulating film immediately beneath the gate electrode 215, an N-type channel region lightly doped with an N-type impurity is formed. Formed on opposing sides of the N-type channel region in the active area 30 are a source region and a drain region, doped with a P-type impurity at a doping density higher than that at the channel region. The source region is connected to the first power source line 210 through a contact hole 213 formed in the first interlayer insulating film, and the drain region is connected to the output wiring 240 through a contact hole 241 formed in the first interlayer insulating film.

In the active area 30 below the gate insulating film immediately beneath the gate electrode 215 in the N-channel-type MOSFET, a P-type channel region lightly doped with the P-type impurity is formed. Formed on opposing sides of the P-type channel region in the active area 30 are a source region and a drain region, doped with the N-type impurity at a doping density higher than that at the channel region. The source region is connected to the second power source line 220 through a contact hole 223 formed in the first interlayer insulating film, and the drain region is connected to the output wiring 240 through a contact hole 242 formed in the first interlayer insulating film.

As shown, the channel region of the P-channel-type MOSFET extends rightward, to become a contact region. The contact region is connected to an extension wiring 250 constructed of the first aluminum layer through a contact hole 219 formed in the first interlayer insulating film. The extension wiring 250 is, in turn, connected to a light shielding layer (area surrounded by a dotted line) 212 via a contact hole 251 formed in a second interlayer insulating film. The channel region of the N-channel-type MOSFET extends rightward, to become a contact region. The contact region is connected to an extension wiring 260 constructed of the first aluminum layer through a contact hole 229 formed in the first interlayer insulating film. The extension wiring 260 is, in turn, connected to a light shielding layer (area surrounded by a dotted line) 222 via a contact hole 261 formed in the second interlayer insulating film. The light shielding layers 212 and 222 are respectively constructed of the second aluminum layer, and are separated from each other. The light shielding layer 212 is connected to the first power source line 210, which is a layer below it, through a contact hole 211 formed in the second interlayer insulating film, and is supplied with the high power source potential VDD. On the other hand, the light shielding layer 222 is connected to the second power source line 220, which is a layer below it, through a contact hole 221 formed in the second interlayer insulating film, and is supplied with the low power source potential VSS. One of the high power source potential VDD and the lower power source potential VSS is preferably the ground potential (GND). When the switching transistor for each pixel in each pixel area is the N-channel-type MOSFET, as already described, the low power source potential VSS applied to the light shielding layer 11 in the pixel area and the light shielding layer 212 for shielding the N-channel-type MOSFET in the peripheral circuits is preferably the ground potential GND, because more MOSFET channels are stabilized in the liquid-crystal panel. On the other hand, when the switching transistor for each pixel in each pixel area is the P-channel-type MOSFET, as already described, the high power source potential VDD applied to the light shielding layer 11 in the pixel area and the light shielding layer 222 for shielding the P-channel-type MOSFET in the peripheral circuits is preferably the ground potential GND, because more MOSFET channels are stabilized in the liquid-crystal panel.

In the MOSFETs constituting the peripheral circuit, the light shielding layers 212, 222 for the N-type MOSFET and the P-type MOSFET are separated and are supplied with the potentials supplied to the respective sources of the MOSFETs. The MOSFET channel regions are thus supplied with the respective potentials and the potentials of the channel regions are stabilized. Excess carriers generated in the channel regions are drained from the P-type channel region to the high power source potential and the N-type channel region to the low power source potential, and the withstand voltage of the MOSFET is prevented from dropping and the reliability of the MOSFET is improved.

The light shielding layer 212 shields the P-channel-type MOSFET and the contact region, and the light shielding layer 222 shields the N-channel-type MOSFET and the contact region. Leakage currents arising from light is thus controlled in the MOSFETs. The embedded light shielding layer 20 may be employed beneath each MOSFET as in the second embodiment. Like the light shielding layers 212 and 222 above them, the embedded light shielding layers 20 may extend in plane to cover the MOSFETs and are separately arranged. The embedded light shielding layer 20 for the P-channel-type MOSFET is preferably supplied with the high power source potential and the embedded light shielding layer 20 for the N-channel-type MOSFET is preferably supplied with the low power source potential. To stabilize the operation of each MOSFET, the embedded light shielding layer 20 and the light shielding layers 212, 222 above it are preferably connected to the same power source potential.

The second aluminum layer forming the upper light shielding layer, and the embedded light shielding layer are formed of the same layer that also forms the light shielding layer in the pixel area. The conductive layer used as these light shielding layers is used not only as the light shielding layer in the peripheral circuit area but also as an interconnection layer.

(Description of Projector Employing a Liquid-crystal Panel of the Present Invention as a Light Valve)

Figure 12:
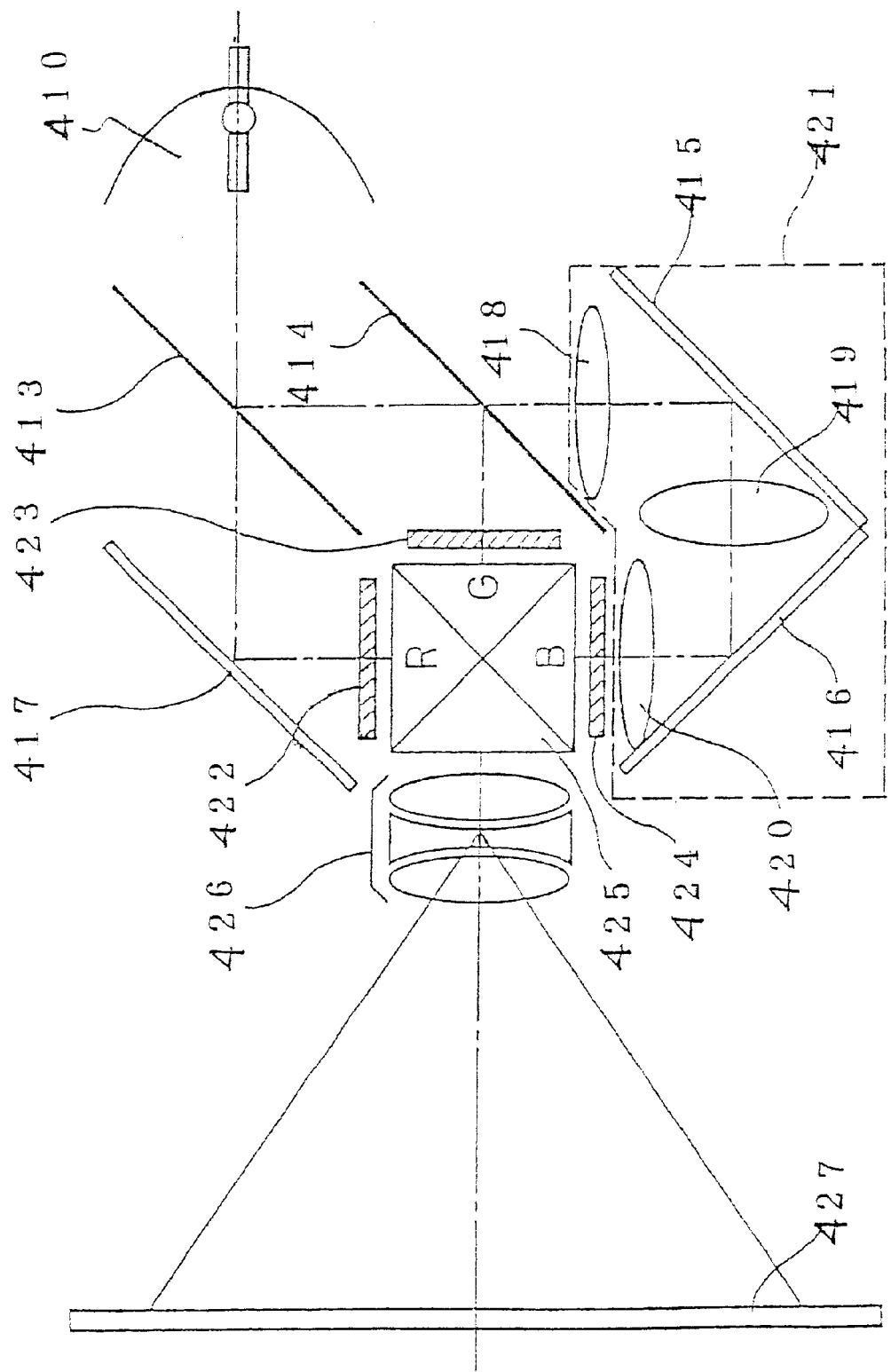
FIG. 12 and FIG. 13 show an optical block diagram showing a projection display apparatus in accordance with the present invention.
Figure 13:
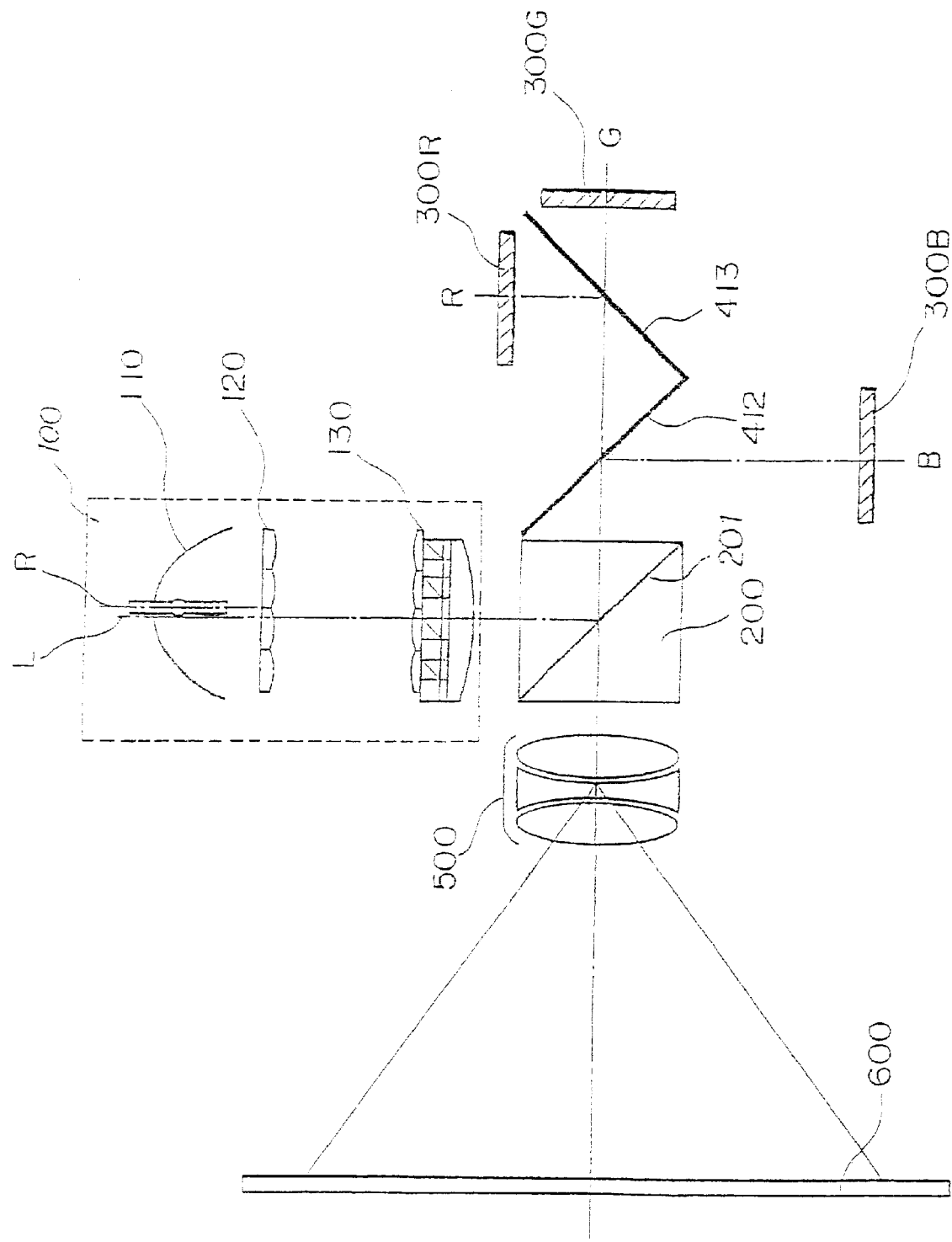

FIG. 12 and FIG. 13 show an optical construction of a critical portion of a projector that incorporates the liquid-crystal panel of the electro-optical device of the present invention.

FIG. 12 is a diagrammatic view showing the critical portion of the projector that incorporates the liquid-crystal panel with a transparent conductive film as a pixel electrode. There are shown a light source 410, dichroic mirrors 413 and 414, reflecting mirrors 415, 416 and 417, relay lenses 418, 419, and 420, liquid-crystal light valves 422, 423, and 424, a cross-dichroic prism 425, and a projection lens 426. The blue-light and green-light reflecting dichroic mirror 413 transmits a red light of the white light flux from the light source 410 while reflecting the blue light and green light. The red light transmitted is reflected by the reflecting mirror 417, and introduced into the red-light liquid-crystal light valve 422. The green light, out of the color lights reflected off the dichroic mirror 413, is reflected from the green-light reflecting dichroic mirror 414, and is introduced into the green-light liquid-crystal light valve 423. On the other hand, the blue light is transmitted through the second dichromic mirror 414. Provided for the blue light is a light guide 421 constructed of a relay lens system including an entrance lens 418, a relay lens 419, and an exit lens 420. The blue light is introduced into the blue light liquid-crystal light valve 424 through the light guide 421. The three color lights modulated by the light valves enter the cross-dichroic prism 425, where the three color lights are synthesized forming a color image. The projection lens 426 as a projection optical system projects the synthesized light onto the screen 427 to display the enlarged image on the screen 427.

FIG. 13 is a diagrammatic view showing a critical portion of the projector that incorporates the liquid-crystal panel of the present invention with an opposing electrode used as a pixel electrode. The projector includes a light source 110, an integrator lens 120, a polarizing illumination device 100 including a polarization converter element 130 as its principal component, a polarization beam splitter 200 that reflects an S-polarized luminous flux output from the polarization illumination-device 100 at an S-polarized luminous flux reflecting surface 20, a dichroic mirror 412 for extracting a blue light component (B) from the light rays reflected from the S-polarized luminous flux reflecting surface 20 of the polarization beam splitter 200, a reflective-type liquid-crystal light valve 300B for modulating the blue light (B) extracted, a dichroic mirror 413 which extracts a red light (R) component from the luminous flux, from which the blue light was already separated, by reflecting the red light( R) component, a reflective-type liquid-crystal light valve 300R for modulating the extracted red light (R), a reflective-type liquid-crystal light valve 300G for modulating the remaining green light (G) that was transmitted through the dichroic mirror 413, and a projection optical system 500 which includes a projection lens which projects a light which is modulated by the three reflective-type liquid crystal light valves 300R, 300G, and 300B, and synthesized by the dichroic mirrors 412 and 423 and the polarization beam splitter 200 onto a screen 600. Each of the three reflective-type liquid-crystal light valves 300R, 300G, and 300B incorporates the above-referenced liquid-crystal panel.

In any of the above projectors, the protective structure for stabilizing the potential at the transistor channel is contained in each pixel in the liquid-crystal panel. The projector projects an image through an active matrix liquid-crystal panel having high performance and high withstand feature.

(Description of an Electronic Equipment Employing, as a Display Device, the Liquid-crystal Panel of the Present Invention)

Figure 14:
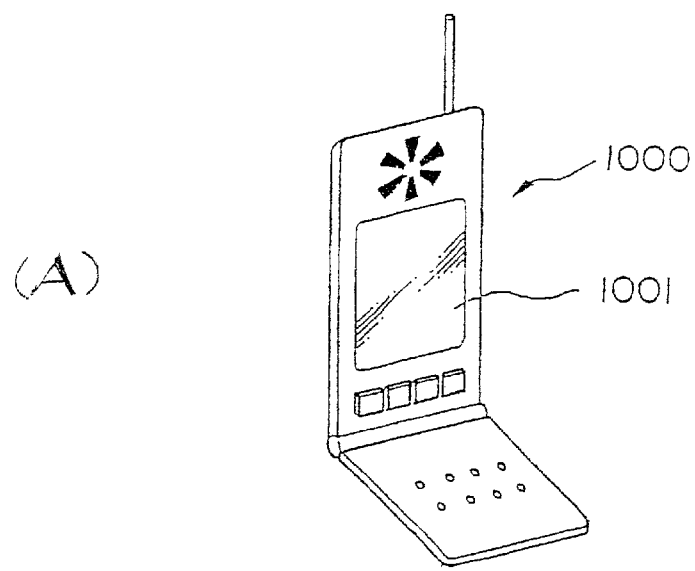
Figure 14:
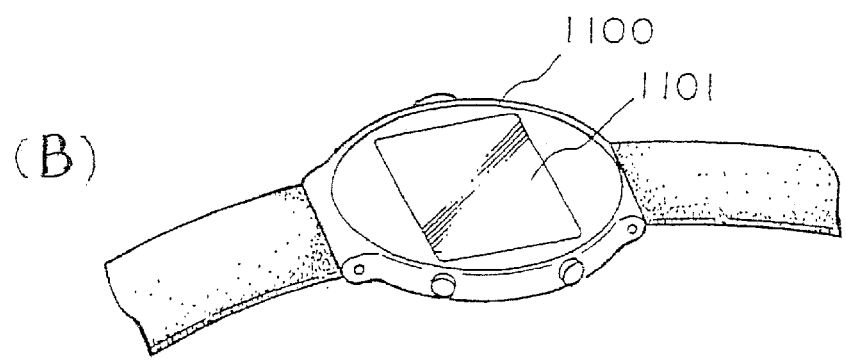
Figure 14:
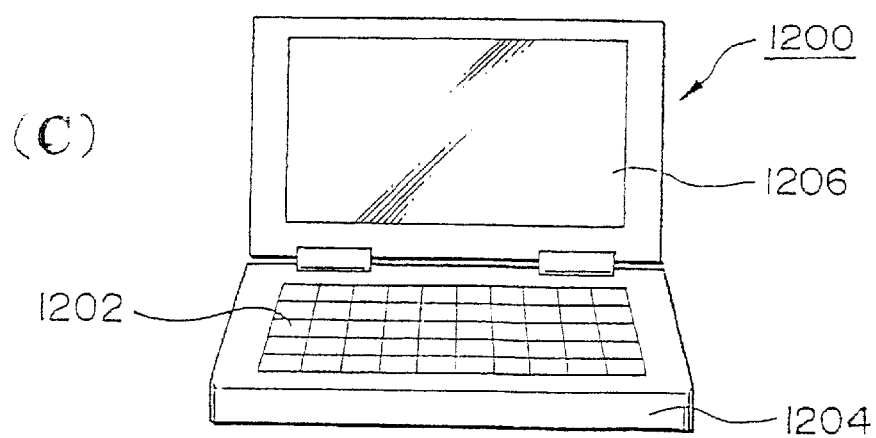

FIG. 14 diagrammatically shows electronic equipment that incorporates a liquid-crystal panel as one example of the electro-optical device of the present invention. FIG. 14(A)

shows a portable telephone 1000 which employs the liquid-crystal panel of the present invention for its display 1001. FIG. 14(B) shows a wristwatch type device 1100 which employs the liquid-crystal panel of the present invention for its display 1101. FIG. 14(C) shows a computer 1200 which employs the liquid-crystal panel of the present invention for its display 1206. The computer 1200 includes a computer body 1204 and an input device 1202 such as a keyboard.

In any of these electronic equipment, the protective structure for draining the excess carrier in the transistor channel is contained in each pixel in the liquid-crystal panel. The projector projects an image through an active matrix liquid-crystal panel having high performance and high withstand feature.

(Alternate Embodiments of the Present Invention)

The embodiments of the present invention are not limited to the preceding ones, and changes and modifications are possible within the scope of the present invention.

For example, a complementary thin-film transistor may be used as a switching transistor in each pixel. The transistor channel regions of the transistors are respectively connected to separate light shielding layers as shown in FIG. 11, and the potential of the channel region is thus stabilized in each of the above-referenced embodiments.

The above embodiments have been discussed in connection with the transmissive-type liquid-crystal panel substrate in which the pixel electrode 14 is a transparent conductive film. The present invention may be applied to a reflective-type liquid-crystal panel, in which the pixel electrode 14 is a reflective electrode or a reflector is arranged on the internal surface or the external surface of the substrate.

The above embodiments have been discussed in connection with the MOSFET (TFT) employing the monocrystalline silicon layer for the source, the drain and the channel. The semiconductor layer is not limited to the monocrystalline silicon. In order to stabilize the channel potential, the present invention may be implemented in a thin-film transistor in which a polycrystalline silicon layer or amorphous silicon layer is used for the source, drain and channel. The present invention is used to supply potential to the channel of the semiconductor layer through a light shielding layer, not only when the semiconductor layer is formed on the substrate using the SOI technique, but also when polycrystalline silicon or amorphous silicon is formed on an insulator using CVD techniques or when monocrystalline silicon is formed on an insulator through solid phase epitaxy or the like.

The above embodiments have been discussed in connection with the liquid-crystal panel. The present invention may be used in an electro-optical device other than the liquid-crystal panel. For example, the present invention may be used in a transistor for switching each pixel in a light emitting device such as an electroluminescence (EL) using a light emitting polymer, a plasma display (PDO), and a field emission device (FED). The present invention may also be used in a transistor for a pixel or in a peripheral circuit in a mirror device, such as a micromirror device (DMD) developed by Texas Instruments, which changes the orientation of a mirror of each pixel.

Although the transmissive-type liquid crystal panel is used in the above-referenced embodiments, this is only an example of the semiconductor device in which the MOSFET is formed on the insulator. The present invention is not limited to this, and may be used in a diversity of semiconductor devices including an image input device for optically reading an image and other various integrated circuits. In such a case, a MOSFET is formed on an insulator, and a light shielding layer formed to cover the MOSFET is electrically connected to the channel region of the MOSFET. A potential is applied to the channel region of the MOSFET to stabilize the operation of the MOSFET and result in an increased withstand voltage of the MOSFET. The structure shown in FIG. 11, in particular, may find widespread use in general semiconductor IC devices constructed of a MOSFET in which a channel region is formed on a semiconductor layer on an insulator.

In accordance with the present invention, as discussed above, the channel region is supplied with a potential through a light shielding layer for shielding the MOSFET in the MOSFET formed on the insulator to stabilize the operation of the MOSFET and control the degradation of withstand voltage of the MOSFET. Particularly, when the display device of the present invention is used, a substrate of an electro-optical device having a large aperture ratio of the pixel area is provided by using the light shielding layer overlapping the scanning line as an interconnection for supplying the channel region with the potential. Even with the same light source having the same lightness, a larger aperture ratio provides a lighter screen. If the same lightness given in the conventional art is acceptable, a smaller power consumption light source work equally. A high-performance display device is thus provided.

INDUSTRIAL APPLICABILITY

In accordance with the present invention, the operation of a transistor is stabilized and the degradation of the withstand voltage of the transistor is controlled, by connecting a channel region of the transistor, namely, the channel region of a semiconductor layer on an insulator, to the conductive layer of a light shielding layer. The present invention is used in general electro-optical devices including common semiconductor devices and liquid-crystal panels. Such a device may be incorporated in a diversity of electronic equipment including the projector.

What is claimed is:

1. A semiconductor device having a semiconductor layer formed on an insulator, the semiconductor device comprising:

a transistor in which at least a channel region is formed with a portion of the semiconductor layer; and a light shielding layer that shields the transistor from a light ray, the light shielding layer being electrically connected to the channel region of the transistor.

2. The semiconductor device according to claim 1, the transistor being an N-channel-type transistor, and the light shielding layer electrically connected to the channel region of the N-channel-type transistor being supplied with a low power source potential.

3. The semiconductor device according to claim 1, the transistor being an N-channel-type transistor, and the light shielding layer electrically connected to the channel region of the N-channel-type transistor being supplied with a voltage equal to or lower than a lowest potential supplied to one of a source and a drain of the N-channel-type transistor.

4. The semiconductor device according to claim 1, the transistor being a P-channel-type transistor, and the light shielding layer electrically connected to the channel region of the P-channel-type transistor being supplied with a high power source potential.

5. The semiconductor device according to claim 1, the transistor being a P-channel-type transistor, and the light shielding layer electrically connected to the channel region of the P-channel-type transistor being supplied with a voltage equal to or higher than a highest voltage of a potential supplied to one of a source and a drain of the P-channel-type transistor.

6. The semiconductor device according to claim 1, the semiconductor layer portion in the channel region of the transistor extending and forming a contact region of the same conductive type, and the contact region being electrically connected to the light shielding layer.

7. The semiconductor device according to claim 6, the contact region being higher in impurity doping density than the channel region.

8. The semiconductor device according to claim 1, the light shielding layer overlapping the transistor.

9. A semiconductor device having a semiconductor layer formed on an insulator, the semiconductor device comprising:
   a P-channel-type transistor and an N-channel-type transistor, each transistor having at least a channel region formed with a portion of the semiconductor layer;
   a first light shielding layer that shields the P-channel-type transistor from a light ray; and
   a second light shielding layer that shields the N-channel-type transistor from a light ray, the first light shielding layer and the second light shielding layer being separately arranged, the first shielding layer being electrically connected to the channel region of the P-channel-type transistor and the second shielding layer being electrically connected to the channel region of the N-channel-type transistor.

10. The semiconductor device according to claim 9, the first light shielding layer being supplied with a high power source potential and the second light shielding layer being supplied with a low power source potential.

11. A semiconductor device according to claim 9, the semiconductor layer portion in the channel region of the P-channel-type transistor and the semiconductor layer portion in the channel region of the N-channel-type transistor extending and forming respective contact regions of a same respective conductive types and the contact regions being respectively electrically, connected to the light shielding layers.

12. The semiconductor device according to claim 9, the P-channel-type transistor and the N-channel-type transistor forming a driving circuit for an electro-optical device.

13. An electro-optical device comprising:
   a substrate;
   a transistor arranged for each pixel area of a matrix of a plurality of pixel areas formed on the substrate; and
   a semiconductor layer to become a channel region for the transistor being formed on the substrate, which shields the transistor from a light ray and is electrically connected to a light shielding layer applied with a predetermined potential.

14. The electro-optical device according to claim 13, the transistor being an N-channel-type transistor and the light shielding layer being applied with a potential equal to or lower than a potential of a video signal supplied to the transistor.

15. The electro-optical device according to claim 13, the transistor being a P-channel-type transistor and the light shielding layer being applied with a potential equal to or higher than the potential of a video signal supplied to the transistor.

16. The electro-optical device according to claim 13, the transistor bins an N-channel-type transistor and the light shielding layer being applied with a deselection potential of a scanning signal that controls the N-channel-type transistor for a conductive state and a non-conductive state.

17. The electro-optical device according to claim 13, the transistor being a P-channel-type transistor and the light shielding layer being applied with a deselection potential of a scanning signal that controls the P-channel-type transistor for a conductive state and a non-conductive state.

18. The electro-optical device according to claim 13, the semiconductor layer portion in the channel region of the transistor extending and forming a contact region of a same conductive type: and the contact region being electrically connected to the light shielding layer.

19. The electro-optical device according to claim 18, the contact region being higher in impurity doping density than the channel region.

20. The electro-optical device according to claim 13, the light shielding layer overlapping, in a plane, a scanning line with which a scanning signal for controlling the transistor for a conductive state and a non-conductive state is applied.

21. The electro-optical device according to claim 20, further comprising a further light shielding layer extending, in a plane, over a substrate side of the semiconductor layer to become the channel region of the transistor.

22. The electro-optical device according to claim 13, further comprising a peripheral circuit arranged on the substrate surrounding the pixel area, and the semiconductor layer to become the channel region of the transistor forming the peripheral circuit being electrically connected to the light shielding layer that shields the transistor from a light ray.

23. The electro-optical device according to claim 22, the peripheral circuit comprising:
   a P-channel-type transistor and an N-channel-type transistor;
   a first light shielding layer that shields the P-channel-type transistor from a light ray; and
   a second light shielding layer that shields the N-channel-type transistor from a light ray, the first light shielding layer and the second light shielding layer being separately arranged, and the first shielding layer being electrically connected to a channel region of the P-channel-type transistor and the second shielding layer being electrically connected to a channel region of the N-channel-type transistor.

24. The electro-optical device according to claim 22 the light shielding layer of the pixel area and the light shielding layer of the peripheral circuit being formed of a same layer.

25. The electro-optical device according to claim 22, the light shielding layer of the pixel area and an interconnection layer of the peripheral circuit being formed of a same layer.

26. The electro-optical device according to claim 23, the transistor of the pixel area being an N-channel-type transistor, and the light shielding layer of the pixel area and the light shielding layer of the N-channel-type transistor in the peripheral circuit being applied with ground potential.

27. The electro-optical device according to claim 23, the transistor of the pixel area being a P-channel-type transistor, and the light shielding layer of the pixel area and the light shielding layer of the P-channel-type transistor in the peripheral circuit being applied with ground potential.

28. The electro-optical device according to claim 13, the substrate being formed of an insulating material.

29. The electro-optical device according to claim 13, the substrate being formed of a quartz substrate.

30. The electro-optical device according to claim 13, the substrate being formed of a glass substrate.

31. The electro-optical device according to claim 13, the substrate being an element substrate and the electro-optical device further comprising an opposing substrate, the element substrate and the opposing substrate being separated by a sealed-in electro-optical material.

32. An electronic equipment comprising, as a display device, the electro-optical device according to claim 31.

33. A projector comprising:

a light source;

an electro-optical device according to claim 31 that modulates a light beam from the light source; and projection optical device that projects the light beam modulated by the electro-optical device.

* * * * *